(12) United States Patent
Du et al.

(10) Patent No.: US 12,557,257 B2
(45) Date of Patent: Feb. 17, 2026

(54) MATTE-TYPE ELECTROMAGNETIC INTERFERENCE SHIELDING FILM COMPRISING BIO-BASED COMPONENT AND PREPARATION METHOD THEREOF

(71) Applicant: ASIA ELECTRONIC MATERIAL CO., LTD., Chubei (TW)

(72) Inventors: Bo-Sian Du, Chubei (TW); Wei-Chih Lee, Chubei (TW); Chia-Hua Ho, Chubei (TW); Chih-Ming Lin, Chubei (TW); Chien-Hui Lee, Chubei (TW)

(73) Assignee: ASIA ELECTRONIC MATERIAL CO., LTD., Hsin-Chu County (TW)

( * ) Notice: Subject to any disclaimer, the term of this patent is extended or adjusted under 35 U.S.C. 154(b) by 258 days.

(21) Appl. No.: 18/352,314

(22) Filed: Jul. 14, 2023

(65) Prior Publication Data
US 2024/0107731 A1 Mar. 28, 2024

(30) Foreign Application Priority Data
Sep. 7, 2022 (TW) .................................. 111133918

(51) Int. Cl.
*H05K 9/00* (2006.01)
(52) U.S. Cl.
CPC ......... *H05K 9/0088* (2013.01); *H05K 9/0083* (2013.01); *H05K 9/0092* (2013.01)
(58) Field of Classification Search
None
See application file for complete search history.

(56) References Cited

FOREIGN PATENT DOCUMENTS

| CN | 203194086 U | | 9/2013 | |
|---|---|---|---|---|
| CN | 203859982 U | | 10/2014 | |
| CN | 205864954 U | | 1/2017 | |
| CN | 206481556 U | | 9/2017 | |
| CN | 206650912 U | * | 11/2017 | ............... H05K 1/02 |
| CN | 107791641 B | | 1/2020 | |
| CN | 210275019 U | | 4/2020 | |
| CN | 108541204 B | | 11/2020 | |
| CN | 112341787 A | * | 2/2021 | ............... C08L 71/12 |

(Continued)

OTHER PUBLICATIONS

Lin—CN 206650912 U—MT—matte EM shield w—3 layers—2017 (Year: 2017).*

(Continued)

*Primary Examiner* — John Vincent Lawler
(74) *Attorney, Agent, or Firm* — HSML P.C.

(57) ABSTRACT

The present disclosure provides a matte-type electromagnetic interference shielding film including bio-based components, which includes a bio-based insulating layer, a bio-based adhesive layer, a metal layer, and a bio-based electrically conductive adhesive layer. The matte-type electromagnetic interference shielding film including the bio-based component of the present disclosure has a matte appearance and high bio-based content and has the advantages of good surface insulation, high surface hardness, good chemical resistance, high shielding performance, good adhesion strength, low transmission loss, high transmission quality, good operability, high heat resistance, and the inner electrically conductive adhesive layer with long shelf life and storage life. The present disclosure further provides a preparation method thereof.

16 Claims, 6 Drawing Sheets

(56) References Cited

FOREIGN PATENT DOCUMENTS

| CN | 215073724 U | * | 12/2021 | ................ C09J 7/29 |
| CN | 114395216 A | * | 4/2022 | .............. C08J 3/246 |
| CN | 114650721 A | * | 6/2022 | ........... H05K 9/0088 |
| KR | 20190067670 A | * | 6/2019 | ........... H05K 9/0084 |
| KR | 20200049085 A | * | 5/2020 | ............. H05K 3/281 |

OTHER PUBLICATIONS

Jeong—KR 2019-0067670 A—MT—EM shield w—roughness—2019 (Year: 2019).*
Kim—KR 2020-0049085 A—MT—w—roughness ratio—2020 (Year: 2020).*
Li—CN 215073724 U—MT—matte EM shield w—multiple layers—2021 (Year: 2021).*
Li—CN 112341787 A—MT—bio-based resin for circuit boards—Feb. 2021 (Year: 2021).*
Su—CN 114650721 A—MT—multilayer EM w—roughness—Jun. 2022 (Year: 2022).*
Zhang—CN 114395216 A—MT—bio-based epoxy for circuits—Apr. 2022 (Year: 2022).*

* cited by examiner

MATTE-TYPE ELECTROMAGNETIC INTERFERENCE SHIELDING FILM COMPRISING BIO-BASED COMPONENT AND PREPARATION METHOD THEREOF

CROSS-REFERENCE TO RELATED APPLICATIONS

This application claims priority to Taiwan Patent Application No. 111133918, filed on Sep. 7, 2022. The entirety of the above-mentioned patent application is hereby incorporated by reference herein and made a part of this specification.

BACKGROUND

1. Technical Field

The present disclosure relates to a technical field of shielding film having high shielding performance, especially to a matte-type electromagnetic interference shielding film comprising bio-based components and a preparation method thereof.

2. Description of Related Art

Bio-based material is an important renewable material, which has the properties of reusability and renewability as solar energy, wind energy, geothermal energy and the like, and its use in plant growth contributes to the absorption of carbon dioxide and reduces in accumulation of greenhouse gases. Recently, various technologies about bio-based materials have been developed to replace existing technologies about petrochemical-based materials. The bio-based products developed can replace the existing petrochemical-based products gradually to meet the future actual requirements on energy-saving and carbon reduction and avoidance of earth resources depletion. Additionally, the process conditions requirement on various bio-based products also gradually reduce the reliance of human beings on petroleum, increasing the use of reproducible agricultural resources, thereby being useful in the reduction of adverse effects on the environment and health. The methods of promoting the sales of bio-based products in the market can be mainly classified into the following two categories: (1) mandatory procurement of bio-based products by government agencies and their contractors; and (2) the voluntary labeling of the bio-based products by operators to explain to consumers the content of the verified bio-based components contained in their products or packages. The detection of bio-based content is mainly performed by one of the three methods described in ASTM D6866 (14° C. Assay), e.g., the Japan Organic Recycling Association (JORA) measures the weight percentages (wt. %) of the biomass-derived component vs. the petroleum-derived components, the United States Department of Agriculture (USDA) measures the ratio of the biomass-derived carbon to the petroleum-derived carbon according to the modified ASTM D6866-12, and other countries mostly define whether the material tested belongs to bio-based plastics and the extent thereof to which the material tested is bio-based by the proportions of the biomass-derived component and the petroleum-derived component.

For the design of the shielding film, there is a demand for black polyimide film to meet the requirement of product aesthetics, surface protection, and so on. Additionally, most of the polyimide in the market are prepared by casting, but because the size stability of the film made by the uniaxial extension method of casting is not enough to meet the industrial demand, the biaxial extension method is often required, which has higher requirements for equipment and process. Also, responding to market demand for thinning design of electronic products, the thickness of the flexible board material should be decreased during the production of a flexible printed circuit (FPC) multi-layered board to achieve an ultra-thin product that meets the requirements of users. However, when a manufacturer of polyimide designed the thinning thickness to be 5 to 7.5 µm in order to reduce the thickness of the thin film, in addition to the difficulty to meet the requirement for a matte surface (with a gloss less than 25 GU) in appearance, general technical indexes such as mechanical strength, processing operability, bending and the like are failing to meet the requirements of the industrial criterion, and the production yield rate is low.

Additionally, development works of scientific research institutions have attempted to develop bio-based polyimide resin thin film manufactured from recoverable regeneration raw materials as bio-based raw materials, for example, institutions such as the Institute of Materials Science and Engineering, Tsinghua University, Institute of Polymer, Department of Chemical Engineering, Tsinghua University, Changchun Institute of Applied Chemistry Chinese Academy of Sciences, Jilin University manufacture a series of polyimide resins comprising bio-based components from recoverable regeneration raw materials including isosorbitol, isomannite, lignin derivative (Acta Polymerica Sinica, 2006 (2): 284-288; Polymer, 2015, 74:38-45; Acta Polymerica Sinica, 2019 (3): 261-270). However, the recoverable regeneration raw materials contain a large number of aliphatic functional groups, so the polyimide films made of the resin prepared from such raw materials are generally poor in heat resistance and mechanical properties. Therefore, although a polyimide resin can be made from the recoverable regeneration raw materials, it is urgent to overcome the problems of insufficient performance of the polyimide film made therefrom.

In order to solve the bottlenecks from the use of the aforementioned polyimide thinned thin film and colored thin film in a shielding film, a colored polyimide film can be replaced with an epoxy resin or polyurethane ink cooperated with a release film to obtain an insulating layer having a thinner thickness and a matte surface. However, such an ink-type insulating layer exhibits mechanical strength, insulation, hardness, chemical resistance, and thermal resistance generally worse than a black polyimide film. It is further developed to coat a release film with a polyimide varnish system, and meanwhile, a design for using a bio-based component also can be incorporated into this process. Nevertheless, the polyimide film prepared from a bio-based polyimide resin generally has poor thermal resistance and poor mechanical performance, it is possible to obtain an insulating layer with several advantages including high flame retardance, high ion purity, high hardness, high thermal conductivity, high bio-based content by a method such as changing the resin in or doping powders into the insulating layer and by manners of changing the content proportion or particle size design of powders. Further, since the varnish-type insulating layer has no residual stress due to a stretching process, it has better size stability than the thin film produced by the casting method, and the varnish type is easier to process in downstream processes when compared to the thin film directly formed on a release film.

In addition, with the increasing demand for electromagnetic interference shielding performance, the metal layer in an electromagnetic interference shielding film structure becomes thicker and thicker. However, its disadvantages also emerge as the thickness of the metal layer increases, it is especially obvious in the solder heat resistance of an electromagnetic interference shielding film and in a simulated client Surface Mount Technology (SMT) process, e.g., a large area popcorn effect occurs in an immersion, tin test after a curing process under normal conditions, a large area popcorn effect occurs in a shielding film process after SMT process or the on-resistance in a circuit increases significantly in SMT process, and a series of weatherability problems is caused when a thicker shielding metal layer is used in combination with a thinner shielding metal layer, for example, significantly increased on-resistance under high temperature and high humidity environment or under thermal shock test conditions, and decreased adhesion capacity which even causes the problems of the shielding metal layer delamination and so on.

The background aforementioned describes products type and technical bottlenecks which can be seen in CN 203194086U disclosing an ink-type electromagnetic shielding film comprising no metal layer; CN 203859982U and CN205864954U both disclosing an ink-type electromagnetic shielding film with plated metal; CN 107791641B, CN 206481556U, and CN 108541204B all disclosing a thin-film type electromagnetic shielding film with plated metal; and CN 210275019U disclosing an electromagnetic shielding film with a matting bottom coating in the outer layer and using electrically conductive fibers instead of metal.

SUMMARY

The object of the present disclosure is to provide a matte-type electromagnetic interference shielding film and a preparation method thereof, the matte-type electromagnetic interference shielding film, comprising bio-based components, has advantages of good surface insulation, high surface hardness, good chemical resistance, high shielding performance, good adhesion strength, low transmission loss, high transmission quality, high bio-based content, matte appearance, good operability, high heat resistance, long shelf life of the inner electrically conductive adhesive layer, and long storage life.

For this purpose, the present disclosure provides a matte-type electromagnetic interference shielding film comprising bio-based component, comprising: a bio-based electrically conductive adhesive layer with a thickness of 3 to 50 μm and comprising a bio-based resin and a petrochemical-based resin; a metal layer having a thickness of 0.1 to 15 μm, which is a plated metal layer or a porous metal layer and is formed on the bio-based electrically conductive adhesive layer; and a bio-based insulating layer having a thickness of 2 to 50 μm, which comprises a bio-based resin and a petrochemical-based resin and is formed on the metal layer, allowing the metal layer to be located between the bio-based insulating layer and the bio-based electrically conductive adhesive layer, wherein the bio-based insulating layer has a first surface and a second surface, the second surface is opposite to the first surface and faces towards the metal layer, and the first surface and the second surface have different surface roughness Rz which are between 0.001 to 10 μm, and the matte-type electromagnetic interference shielding film contains a bio-based content of 20% to 100%, by the ratio of the biomass-derived carbon to the petroleum-derived carbon, according to ASTM D6866-12.

In an embodiment, the matte-type electromagnetic interference shielding film comprising bio-based component further comprises a bio-based adhesive layer with a thickness of 2 to 50 μm which comprises a bio-based resin and a petrochemical-based resin and is formed on the metal layer, allowing the metal layer to be located between the bio-based adhesive layer and the bio-based electrically conductive adhesive layer.

In an embodiment, the matte-type electromagnetic interference shielding film comprising bio-based component further comprises a support layer having a thickness of 12.5 to 250 μm, which is formed on the first surface of the bio-based insulating layer, allowing the first surface of the bio-based insulating layer has a gloss of 0 to 60 GU at a measuring angle of 60° after the support layer is peeled off.

In an embodiment, the support layer is a support film or a release film, and the material forming the support layer is at least one selected from the group consisting of polypropylene, polyethylene terephthalate, polyimide, polyphenylene sulfide, polyethylene naphthalate, polyurethane, and polyamide, wherein the polypropylene is a biaxially oriented polypropylene.

In an embodiment, the support layer comprises an inorganic powder, which is at least one selected from the group consisting of calcium sulfate, carbon black, silica, titania, zinc sulfide, zirconia, calcium carbonate, silicon carbide, boron nitride, alumina, talc, aluminum nitride, glass powder, quartz powder, and clay, and the inorganic powder in the support layer has a particle size of 10 nm to 20 μm.

In an embodiment, the bio-based resin and the petrochemical-based resin in each of the bio-based insulating layer, the bio-based adhesive layer and the bio-based electrically conductive adhesive layer are each independently at least one selected from the group consisting of epoxy resin, acrylic resin, polyurethane, urethane resin, silastic resin, poly-p-xylene resin, bismaleimide resin, styrene-ethylene-butene-styrene block copolymer, polyimide resin and polyamide-imide; wherein the content of the bio-based resin in the bio-based insulating layer is more than 0 to 100 wt. % and the content of the petrochemical-based resin in the bio-based insulating layer is 0 to 80 wt. % based on the total weight of the bio-based insulating layer, the content of the bio-based resin in the bio-based adhesive layer is more than 0 to 100 wt. % and the content of the petrochemical-based resin in the bio-based insulating layer is 0 to 80 wt. % based on the total weight of the bio-based adhesive layer, and the content of the bio-based resin in the bio-based electrically conductive adhesive layer is more than 0 to 95 wt. % and the content of the petrochemical-based resin in the bio-based electrically conductive adhesive layer is 0 to 70 wt. % based on the total weight of the bio-based electrically conductive adhesive layer.

In an embodiment, at least one of the bio-based insulating layer and the bio-based adhesive layer further comprises at least one inorganic powder selected from the group consisting of calcium sulfate, carbon black, silica, titania, zinc sulfide, zirconia, calcium carbonate, silicon carbide, boron nitride, alumina, talc, aluminum nitride, glass powder, quartz powder, and clay, and the inorganic powder has a particle size of 10 nm to 20 μm; wherein the content of the inorganic powder in the bio-based insulating layer is more than 0 to 50 wt. % based on the total weight of the bio-based insulating layer, and the content of the inorganic powder in the bio-based adhesive layer is more than 0 to 50 wt. % based on the total weight of the bio-based adhesive layer.

In an embodiment, at least one of the bio-based insulating layer and the bio-based adhesive layer further comprises at least one flame-retardant compound selected from the group consisting of halogen-containing compounds, phosphor-containing compounds, nitrogen-containing compounds, and boron-containing compounds; wherein the content of the flame-retardant compound in the bio-based insulating layer is 1 to 40 wt. % based on the total weight of the bio-based insulating layer, and the content of the flame-retardant compound in the bio-based adhesive layer is 1 to 50 wt. % based on the total weight of the bio-base adhesive layer.

In an embodiment, at least one of the bio-based insulating layer and the bio-based adhesive layer further comprises an inorganic pigment and/or an organic pigment, and the inorganic pigment is at least one selected from the group consisting of cadmium red, lemon cadmium yellow, orange cadmium yellow, titania, carbon black, black iron oxide and black complexed inorganic pigment, and the organic pigment is at least one selected from the group consisting of aniline black, paliogen black, anthraquinone black, benzidine-based yellow pigment, phthalocyanine blue and phthalocyanine green; wherein the content of the inorganic and/or the organic pigment in the bio-based insulating layer is more than 0 to 50 wt. % based on the total weight of the bio-based insulating layer, and the content of the inorganic and/or the organic pigment in the bio-based adhesive layer is more than 0 to 50 wt. % based on the total weight of the bio-based adhesive layer.

In an embodiment, at least one of the bio-based insulating layers, the bio-based adhesive layer, and the bio-based electrically conductive adhesive layer further comprises an additive which is at least one selected from a curing agent, a catalyst, and a surfactant; wherein the content of the additive in the bio-based insulating layer is more than 0 to 20 wt. % based on the total weight of the bio-based insulating layer, the content of the additive in the bio-based adhesive layer is more than 0 to 20 wt. % based on the total weight of the bio-based adhesive layer, and the content of the additive in the bio-based electrically conductive adhesive layer is more than 0 to 10 wt. % based on the total weight of the bio-based electrically conductive adhesive layer.

In an embodiment, the additive is a curing agent and the additive can be selected from, e.g., 4,4'-diaminodiphenylsulfone.

conductive particles, and the material forming the plurality of electrically conductive particles is at least one selected from the group consisting of copper, silver, nickel, tin, gold, palladium, aluminum, chromium, titanium, zinc, carbon, nickel-gold alloy, gold-silver alloy, copper-nickel alloy, copper-silver alloy, nickel-silver alloy and copper-nickel-gold alloy; wherein the content of the plurality of electrically conductive particles is 5 to 85 wt. % based on the total weight of the bio-based electrically conductive adhesive layer.

In another embodiment, the bio-based electrically conductive adhesive layer has a double-layer structure and is formed by laminating an adhesive layer without electrically conductive particles and an electrically conductive adhesive layer having a plurality of electrically conductive particles; wherein the adhesive layer without electrically conductive particle is adherent between the metal layer and the electrically conductive adhesive layer having the plurality of electrically conductive particles, and the metal layer is a porous metal layer; wherein the content of the plurality of electrically conductive particles in the electrically conductive adhesive layer is 5 to 85 wt. % based on the total weight of the electrically conductive adhesive layer.

In an embodiment, the bio-based resin is a bio-based polyamide-imide resin having imide bond (—C(O)—N(R)—C(O)—); wherein the bio-based polyamide-imide resin at least comprises the constituent unit represented by the formula (I) below:

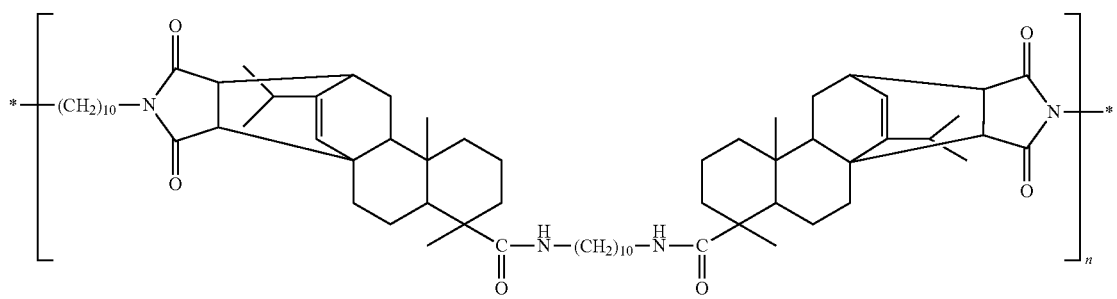

In an embodiment, the plated metal layer is a copper foil layer, a silver foil layer, an aluminum foil layer, or a nickel foil layer having a thickness of 0.1 to 5 μm. In another embodiment, the porous metal layer has a thickness of 2 to 15 μm and has a pore size of 5 μm to 25 μm. The porous metal layer has a pore size of 5 μm to 25 μm, a porosity of 15% to 30%, a tensile strength of more than or equal to 20 kgf/mm2, and an elongation rate of more than or equal to 5%.

In an embodiment, the bio-based electrically conductive adhesive layer is a single-layer bio-based electrically conductive adhesive layer having a plurality of electrically in formula (I), n is 20 to 35.

In an embodiment, the petrochemical-based resin is a petrochemical-based polyamide-imide resin; wherein the petrochemical-based polyamide-imide resin at least comprises the constituent unit represented by the formula (II) below:

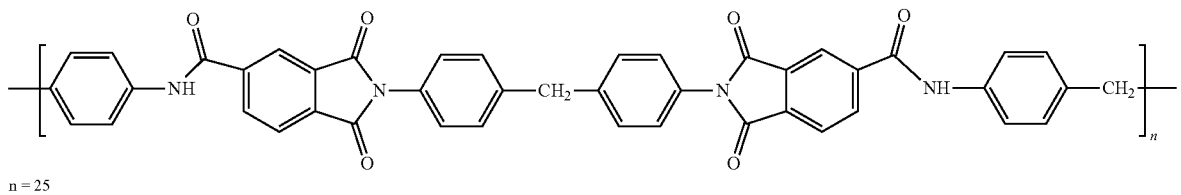

n = 25

In another embodiment, the petrochemical-based resin is selected from bisphenol A epoxy resin, acrylic resin, or combination of bisphenol A epoxy resin and acrylic resin mixed at a weight ratio of 1:1.

The present disclosure provides a preparation method for a matte-type electromagnetic interference shielding film comprising bio-based component, comprising the following steps:
after forming a bio-based insulating layer on a support layer, curing the bio-based insulating layer under a condition of 50° C. to 180° C.;
forming a plated metal layer on the bio-based insulating layer by using one of the selected from vacuum sputtering, evaporation deposition, chemical plating and electroplating;
forming a bio-based electrically conductive adhesive layer on the plated metal layer, allowing the plated metal layer to be located between the bio-based insulating layer and the bio-based electrically conductive adhesive layer; and
laminating a release layer on the bio-based electrically conductive adhesive layer.

In an embodiment, the preparation method of a matte-type electromagnetic interference shielding film comprising bio-based component further comprises the following steps:
prior to forming the plated metal layer, forming another bio-based insulating layer on the bio-based insulating layer and curing said another bio-based insulating layer under a condition of 50° C. to 180° C., then forming the plated metal layer, allowing the plated metal layer to be located between said another bio-based insulating layer and the bio-based electrically conductive adhesive layer.

In an embodiment, the preparation method of a matte-type electromagnetic interference shielding film comprising bio-based component further comprises the following steps:
prior to forming the plated metal layer, forming a bio-based adhesive layer on the bio-based insulating layer or said another bio-based insulating layer by using a coating method or a transfer method, then forming the plated metal layer, allowing the plated metal layer to be located between the bio-based adhesive layer and the bio-based electrically conductive adhesive layer.

In an embodiment, the bio-based insulating layer has a hardness of 2H to 6H.

The present disclosure also provides another preparation method of a matte-type electromagnetic interference shielding film comprising bio-based component, comprising the following steps:
after forming a bio-based insulating layer on a support layer, curing the bio-based insulating layer under a condition of 50° C. to 180° C.;
forming a bio-based adhesive layer on the porous metal layer by using a coating method or a transfer method;
contacting and laminating the bio-based insulating layer and the bio-based adhesive layer, allowing the bio-based adhesive layer to be located between the bio-based insulating layer and the porous metal layer;
forming a bio-based electrically conductive adhesive layer on the porous metal layer; and
laminating a release layer on the bio-based electrically conductive adhesive layer.

In an embodiment, the preparation method of the matte-type electromagnetic interference shielding film comprising bio-based component further comprises the following steps:
posterior to curing the insulating layer, forming another bio-based insulating layer on the bio-based insulating layer, and curing said another bio-based insulating layer under a condition of 50° C. to 180° C.

In an embodiment, the porous metal layer's preparation method comprises the following steps:
coating an aluminum layer on a thin film;
performing a release treatment of the surface of the aluminum layer;
forming a metal layer on the release-treated surface of the aluminum layer by using one of selected from sputtering, evaporation deposition and aqueous plating;
performing a micro-etching treatment on the metal layer to form a plurality of pores; and
peeling off the thin film and the aluminum layer, allowing the metal layer to be a porous metal layer.

In an embodiment, the thin film is a polyimide film or a polyethylene terephthalate film; the metal layer is at least one selected from the group consisting of copper, aluminum, lead, nickel, cobalt, tin, silver, iron, and gold.

The beneficial effects of the present disclosure include at least the following.

1. Most of the black ink layer and the polyimide varnish layer in the market have a surface hardness of HB to 2H, frail surfaces, and ease for scratching to affect the appearance and mechanical performances, while the bio-based insulating layer of the present disclosure has powder added therein, which contributes to the improvement of the hardness (to achieve a hardness of 2H to 6H), and meanwhile, the addition of the powder in different proportions achieves different flame retardant performances. When one or a mixed powder of more than two inorganic powders including titania, silica, alumina, aluminum hydroxide, calcium carbonate and, the like is added in a higher proportion, the product has a higher flame retardance. When a higher hardness is required, it is preferred to use one or a mixed powder of more than two of titania, (sintered) silica and the like. When a higher flame retardant performance is required, it is preferred to use one or a mixture of more than two of aluminum hydroxide, alumina and calcium carbonate and a mixture of one or more flame retardant compounds including halogen-containing compounds, phosphor-containing compounds, a nitrogen-containing compounds or a boron-containing compounds.

2. The existing shielding film employs a thick metal layer and thus is easy to exhibit large area popcorn, increased on-resistance, decreased adhesion capacity and metal layer delamination, etc. in solder heat resistance and SMT process test. The electromagnetic interference shielding film of the present disclosure can comprise a thicker plated metal layer with a thickness of more than 0.2 μm, further more than 0.5 μm, by a manner of adding rougher powders into the bio-based insulating layer (or for example into the second insulating sublayer within the two insulating sublayers, or into the sublayer facing towards the plated metal layer within the multiple insulating sublayers), changing the surface roughness (with Rz roughening to be 3 to 6 μm) and hardness (2 to 6H) on the interface between the bio-based insulating layer and the plated metal layer, and forming defects during metal plating (such as copper plating) or forming cracks during laminating, e.g., forming vent holes or crevices. Alternatively, the electromagnetic interference shielding film of the present disclosure can comprise a porous metal layer which also has a similar function for forming vent holes to significantly improve the solder heat resistance of the entire shielding film, which is beneficial to the reflow soldering process of the back-end products.

3. The existing shielding film employs a conventional plated metal layer, and the electromagnetic interference shielding film of the present disclosure may comprise a porous metal layer and has good electromagnetic interference shielding performance and SMT-resisting properties. In particular, the porous metal layer can reflect electromagnetic waves to reflect most energy of the radio frequency and microwave with an extremely small transmission fraction, thereby exhibiting good shielding performance (more than 60 dB at 1 GHz) and effectively shielding interference due to electromagnetic wave radiation; and compared to the conventional plated metal layer, the porous metal layer can significantly improve the soldering heat resistance of the manufactured product which can have a solder heat resistance of more than 300° C. by a downstream reflow soldering process.

4. The bio-based insulating layer of the present disclosure can comprise a polyimide resin which has a better surface insulating property (such as an insulation resistance value of more than 1012Ω), good impedance control ability, chemical resistance, solder resistance, and high surface hardness compared to the ink insulating layer of an epoxy or polyurethane (PU) system. Compared to the ultra-thin black polyimide film having a thickness of 5 to 7.5 μm, the present disclosure need not carrier film in the process and has a simpler procedure and low cost, while most of the thin films of such thick in the market are failure to gain a Gloss value of less than 60 GU.

5. Due to the composition design of the bio-based insulating layer and the bio-based electrically conductive adhesive, the matte-type electromagnetic interference shielding film comprising a bio-based component of the present disclosure has an overall bio-based content of more than 20% of actual bio-based content in both assays per the JORA Certification and the USDA Certification, and thus can be certified as bio-based plastics by various countries.

BRIEF DESCRIPTION OF THE DRAWINGS

Embodiments of the present disclosure are described by the accompanying exemplary reference figures.

DETAILED DESCRIPTIONS

Embodiments of the present disclosure will be illustrated by following specific examples, anyone skilled in the art can easily realize the advantages and effects of the present disclosure based on the content described in the present specification.

It should be noted that the structure, proportion, size, etc. shown in the figures in the specification are only used to match the contents disclosed in the specification for the understanding and reading of those skilled in the art, and are not intended to define the limiting conditions for the implementation of the present disclosure, so they have no substantially technical significance. Any modification of the structure, change of the proportion relationship, or adjustment of the size, without affecting the efficacy and purpose of the present disclosure, should fall in the scope of the technical content disclosed in the present disclosure. Meanwhile, "a", "an", "lower" and "upper" recited in the specification are also used for clear description but not for defining the scope capable of being implemented by the present disclosure, the change or adjustment of their relative relationship without substantial alteration of the technical contents are also considered within the implementation scope of the present disclosure. Furthermore, all ranges and values recited in the present invention are inclusive and combinable. Any value or point falling in the ranges recited herein, such as any integers, can be used as the lower or upper limit to derive a subrange. When expressed as "comprise", "include", "contain" or "have" components or steps herein, other components or other steps can further be included rather than excluded unless stated otherwise. Additionally, unless expressly stated otherwise, the singular forms "a", "an" and "the" include a plurality of references, and the "or" and "and/or" are used interchangeably herein. It should be noted that the terms such as "first", "second" or "third" for describing various structures in the specification and the attached claims are used for abbreviated reference of these steps/structures and it is not necessary to perform/form these steps/structures in this order.

Figure 1A:
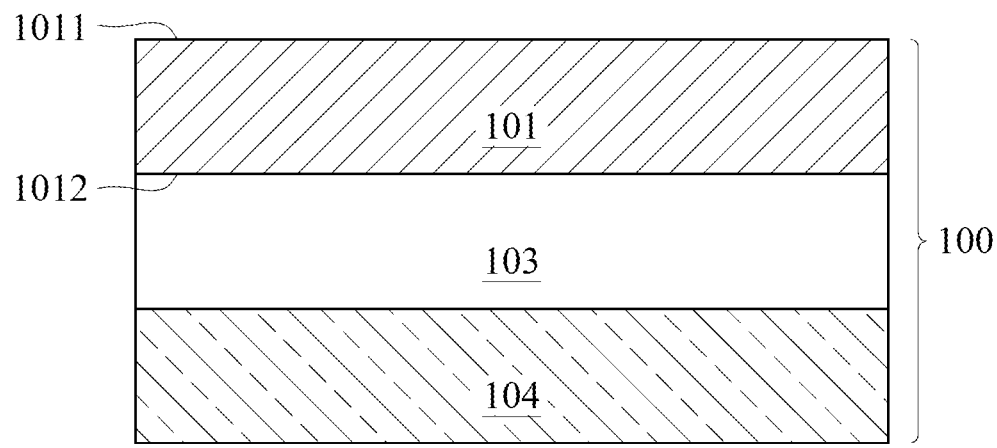
FIG. 1A is a schematic diagram showing the structure of a matte-type electromagnetic interference shielding film comprising bio-based components of the present disclosure in an Example.

As shown in FIG. 1A, the matte-type electromagnetic interference shielding film 100 comprising bio-based component of the present disclosure comprises: a bio-based electrically conductive adhesive layer 104 with a thickness of 3 to 50 μm and comprising a bio-based resin and a petrochemical-based resin; a metal layer 103 having a thickness of 0.1 to 15 μm, which is a plated metal layer or a porous metal layer and is formed on the bio-based electrically conductive adhesive layer 104; and a bio-based insulating layer 101 having a thickness of 2 to 50 μm, which comprises a bio-based resin and a petrochemical-based resin and is formed on the metal layer 103, allowing the metal layer 103 to be located between the bio-based insulating layer 101 and the bio-based electrically conductive adhesive layer 104, wherein the bio-based insulating layer 101 has a first surface 1011 and a second surface 1012, the second surface 1012 is opposite to the first surface 1011 and faces towards the metal layer 103, and the first surface 1011 and the second surface 1012 have different surface roughness Rz.

Figure 1B:
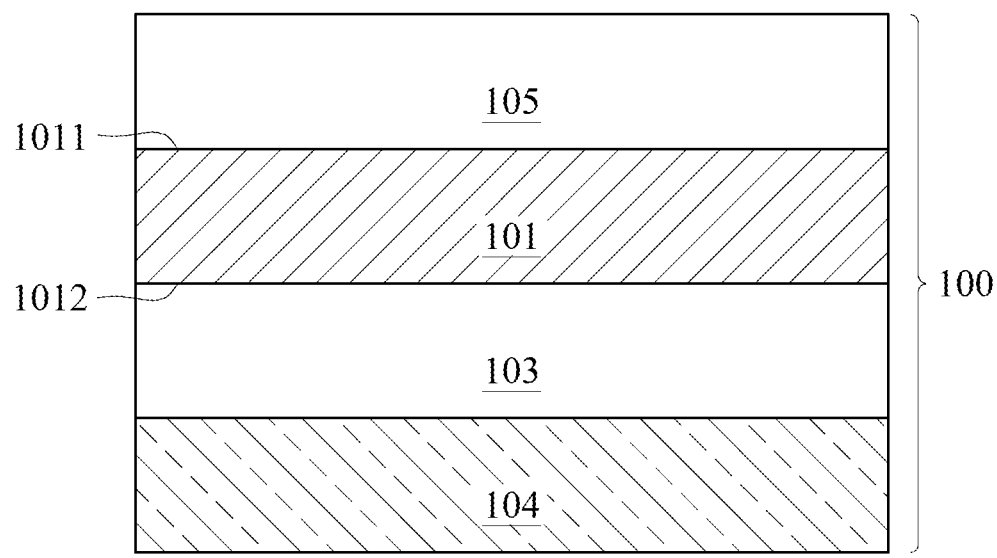
FIG. 1B is a schematic diagram showing the structure of a matte-type electromagnetic interference shielding film comprising bio-based components of the present disclosure in an Example, which further comprises a support layer.

As shown in FIG. 1B, the matte-type electromagnetic interference shielding film 100 comprising bio-based component of the present disclosure further comprises a support layer 105 having a thickness of 12.5 to 250 μm, which is formed on the first surface 1011 of the bio-based insulating layer 101, allowing the first surface 1011 of the bio-based insulating layer 101 has a gloss of 0 to 60 GU, e.g., 0, 1, 2, 3, 4, 5, 10, 15, 20, 25, 30, 35, 40, 45, 50, 55 or 60 GU, at a measuring angle of 60° after the support layer 105 is peeled off, wherein a gloss of 0 to 25 GU is preferred.

Figure 1C:
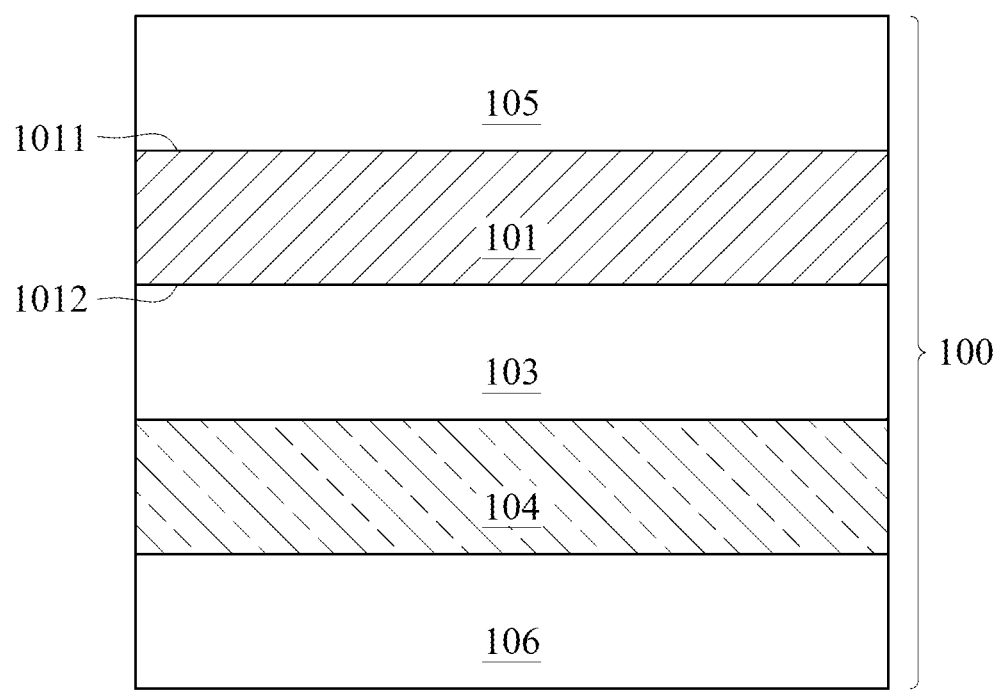
FIG. 1C is a schematic diagram showing the structure of a matte-type electromagnetic interference shielding film comprising bio-based components of the present disclosure in an Example, which further comprises a release layer.

As shown in FIG. 1C, the matte-type electromagnetic interference shielding film 100 comprising bio-based component of the present disclosure further includes a release layer 106 used for protecting the bio-based electrically conductive adhesive layer 104 and formed on the bio-based electrically conductive adhesive layer 104, allowing the bio-based electrically conductive adhesive layer 104 to be located between the metal layer 103 and the release layer 106, wherein the release layer is a release film having a thickness of 25 to 100 μm, a PE-coated paper having a thickness of 25 to 130 μm or a carrier film having a thickness of 25 to 100 μm, and the release film is at least one selected from the group consisting of PET fluoroplastic release film, silicone PET release film, matte PET release film and PE release film.

Figure 1D:
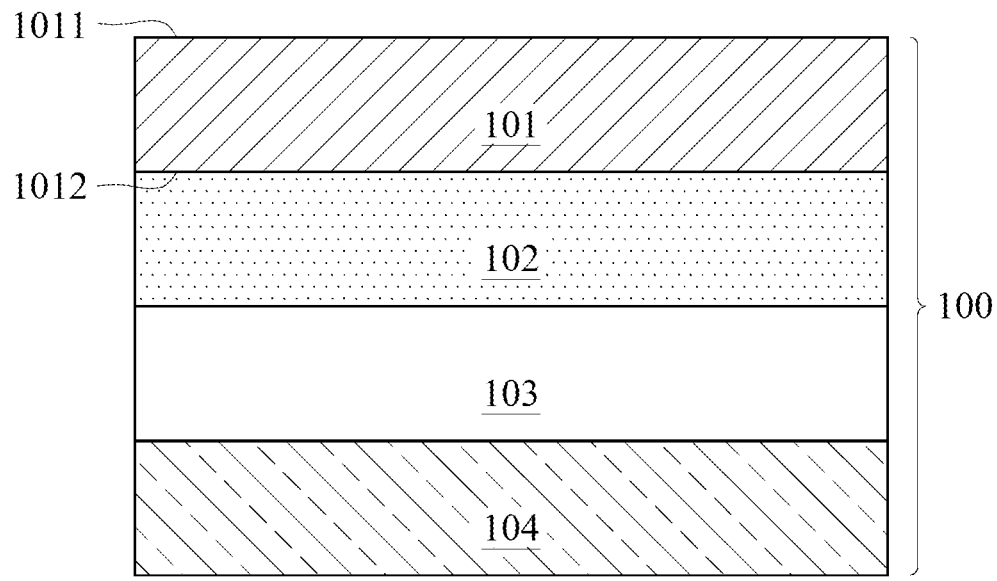
FIG. 1D is a schematic diagram showing the structure of a matte-type electromagnetic interference shielding film comprising bio-based components of the present disclosure in another Example.
Figure 1E:
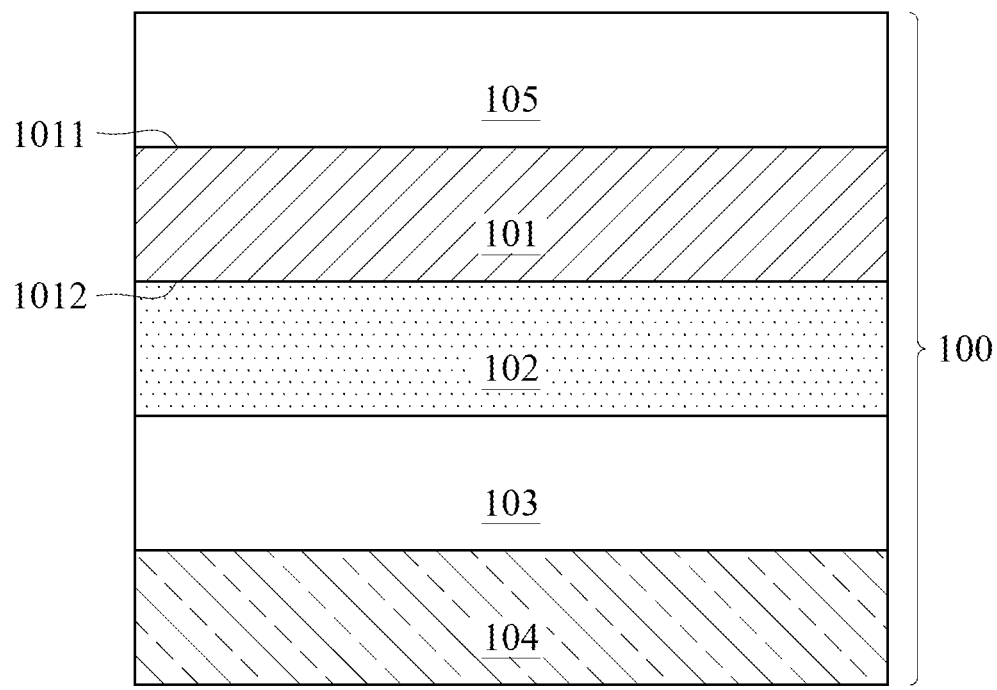
FIG. 1E is a schematic diagram showing the structure of a matte-type electromagnetic interference shielding film comprising bio-based components of the present disclosure in another Example, which further comprises a support layer.
Figure 1F:
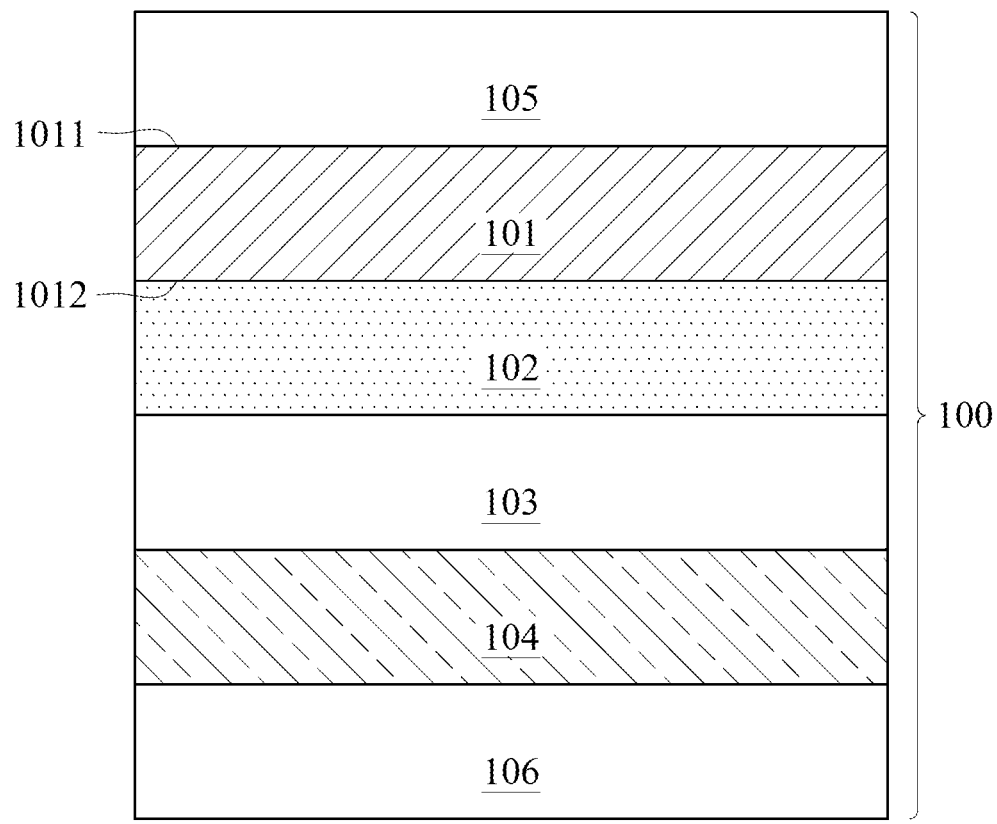
FIG. 1F is a schematic diagram showing the structure of a matte-type electromagnetic interference shielding film comprising bio-based components of the present disclosure in another Example, which further comprises a release layer.

As shown in FIGS. 1D to 1F, the matte-type electromagnetic interference shielding film 100 comprising bio-based component of the present disclosure further comprises a bio-based adhesive layer 102 with a thickness of 2 to 50 μm which comprises a bio-based resin and a petrochemical-based resin and is formed on the metal layer 103, allowing the metal layer 103 between the bio-based adhesive layer 102 and the bio-based electrically conductive adhesive layer 104.

Figure 2:
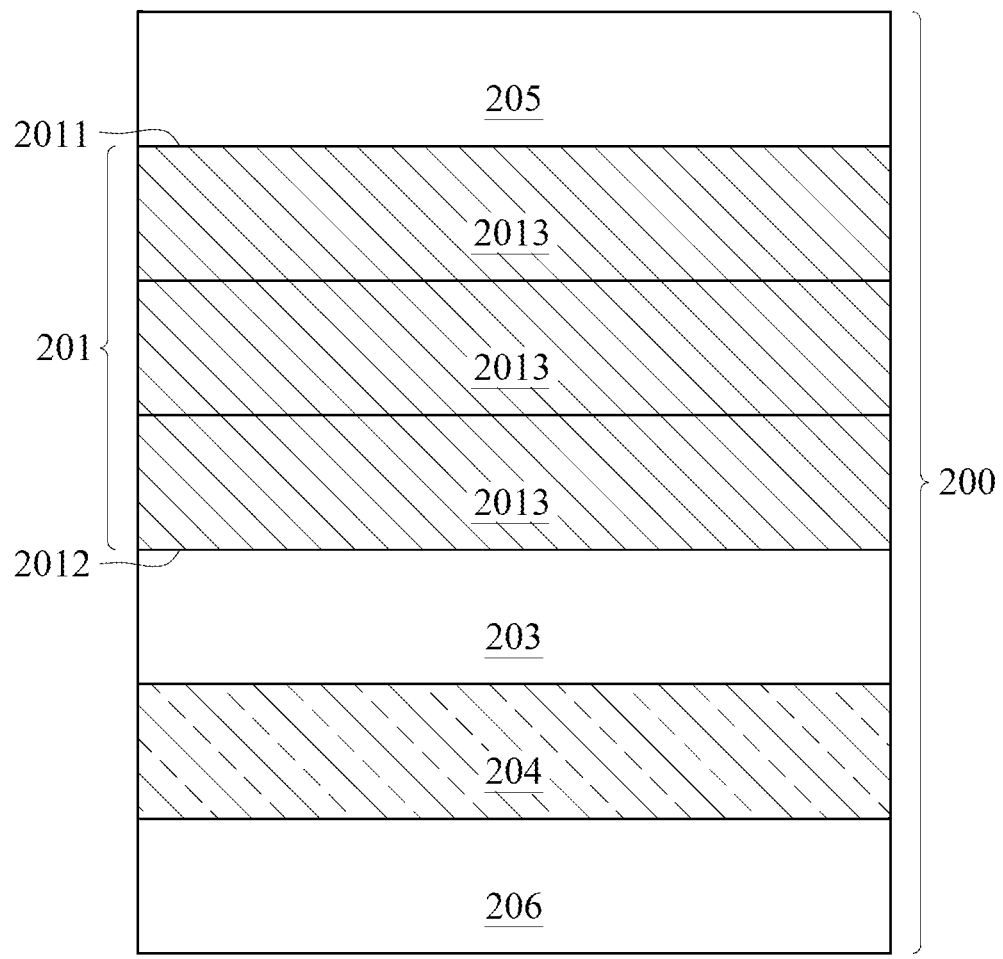
FIG. 2 is a schematic diagram showing the structure of a matte-type electromagnetic interference shielding film comprising bio-based components of the present disclosure in still another Example, and its bio-based insulating layer comprises two or more insulating sublayers.

As shown in FIG. 2, in addition to the embodiment of one bio-based insulating layer 101 described above, the design of the bio-based insulating layer in the matte-type electromagnetic interference shielding film 200 comprising bio-based component of the present disclosure may also comprises another embodiment of a bio-based insulating layer 201 formed by two or more insulating sublayers 2013, wherein the insulating sublayers 2013 may each independently comprises different components, and wherein at least one of the insulating sublayers 2013 comprises bio-based component, and wherein the bio-based insulating layer 201 formed also has a total thickness of 2 to 50 μm. In reference to FIG. 2, the matte-type electromagnetic interference shielding film 200 comprising bio-based component of the present disclosure comprises a release layer 206, a bio-based electrically conductive adhesive layer 204, a metal layer 203, a bio-based insulating layer 201 and a support layer 205, except there is no bio-based adhesive layer 102 included between the metal layer 203 and the bio-based insulating layer 201. In addition, in the embodiment having multiple insulating sublayers, the matte-type electromagnetic interference shielding film comprising bio-based component of the present disclosure also may comprise no support layer 205 and/or release layer 206 (not shown). Further, the bio-based insulating layer 201 also has a first surface 2011 and a second surface 2012, the second surface 2012 is opposite to the first surface 2011 and faces towards the metal layer 203, and the first surface 2011 and the second surface 2012 have different surface roughness Rz.

In an embodiment, the first surface 1011/2011 and the second surface 1012/2012 of the bio-based insulating layer each independently have a surface roughness Rz between 0.001 and 10 μm, e.g., 0.001, 0.005, 0.01, 0.05, 0.1, 0.5, 1, 2, 3, 4, 5, 6, 7, 8, 9 or 10 μm, wherein a surface roughness Rz of 3 to 6 μm is preferred, which promotes the formation of defects during copper plating or cracks during lamination or promotes the formation of defects in the porous metal layer.

Figure 3:
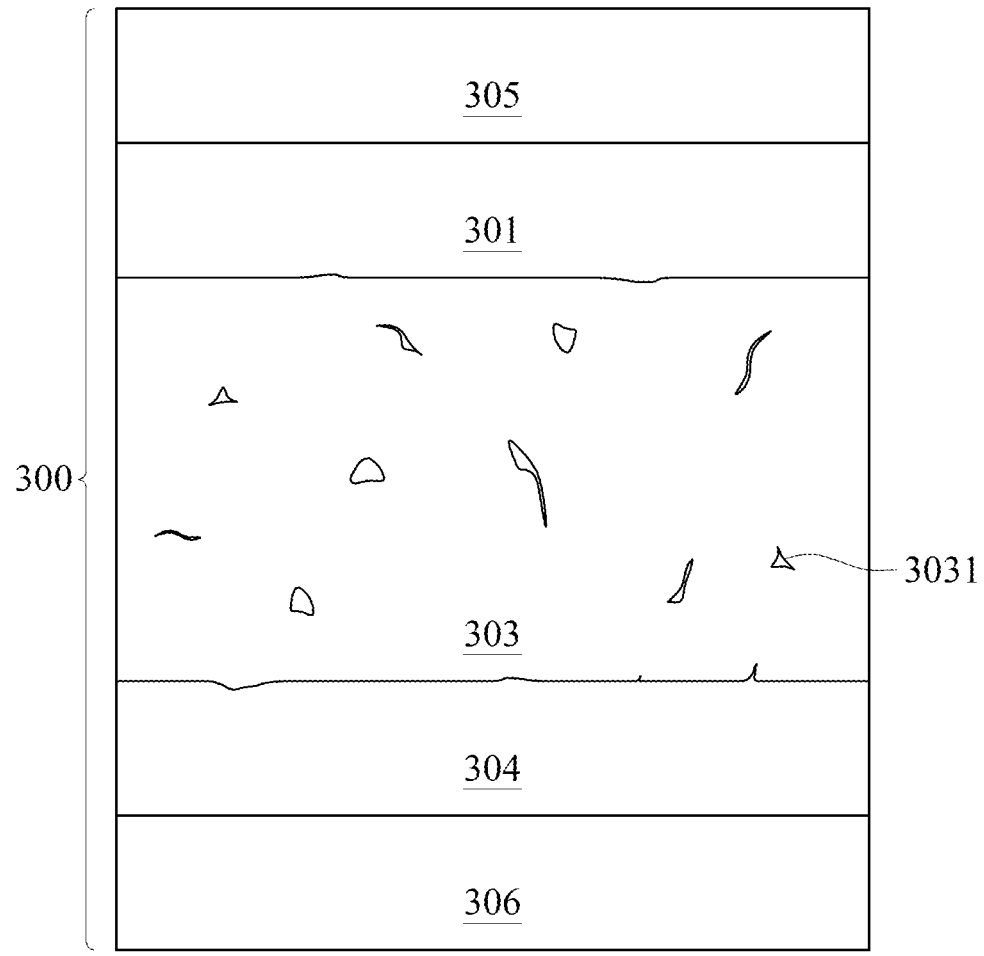
FIG. 3 is a schematic diagram showing the structure of a matte-type electromagnetic interference shielding film comprising bio-based components of the present disclosure in still another Example, and its metal layer comprises one or more defects.

As shown in FIG. 3, the matte-type electromagnetic interference shielding film 300 comprising bio-based component of the present disclosure includes a release layer 306, a bio-based electrically conductive adhesive layer 304, a metal layer 303, a bio-based insulating layer 301 and a support layer 305, wherein the metal layer 303 is a plated metal layer or a porous metal layer. In this embodiment, the metal layer 303 has a larger thickness, and the metal layer 303 includes one or more defects 3031, such as but not limited to, surface recessions, surface protrusions, surface cracks, crevices, gaps, bubbles or vent holes and so on. In addition, in the embodiment having multiple insulating sublayers, the matte-type electromagnetic interference shielding film 300 comprising bio-based component of the present disclosure also may comprise no support layer 305 and/or release layer 306 (not shown).

In an embodiment, the matte-type electromagnetic interference shielding film contains a bio-based content of 20-100%, e.g., 20, 25, 30, 35, 40, 45, 50, 55, 60, 65, 70, 75, 80, 85, 90, 95 or 100%, by the ratio of the biomass-derived carbon to the petroleum-derived carbon, according to ASTM D6866-12.

In an embodiment, the support layer is a support film or a release film, and the material forming the support layer is at least one selected from the group consisting of polypropylene, polyethylene terephthalate, polyimide, polyphenylene sulfide, polyethylene naphthalate, polyurethane and polyamide. In this embodiment, the polypropylene is a biaxially oriented polypropylene.

In an embodiment, the support layer comprises at least one inorganic powder selected from the group consisting of calcium sulfate, carbon black, silica, titania, zinc sulfide, zirconia, calcium carbonate, silicon carbide, boron nitride, alumina, talc, aluminum nitride, glass powder, quartz powder, and clay, to be colored with a non-natural color, and the inorganic powder in the support layer has a particle size of 10 nm to 20 μm, e.g., 10 nm, 20 nm, 30 nm, 40 nm, 50 nm, 100 nm, 200 nm, 300 nm, 400 nm, 500 nm, 600 nm, 700 nm, 800 nm, 900 nm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm or 20 μm.

In an embodiment, the bio-based resin and the petrochemical-based resin in each of the bio-based insulating layer, the bio-based adhesive layer, and the bio-based electrically conductive adhesive layer are each independently at least one selected from the group consisting of epoxy resin, acrylic resin, polyurethane, urethane resin, silastic resin, poly-p-xylene resin, bismaleimide resin, styrene-ethylene-butene-styrene block copolymer, polyimide resin and polyamide-imide, with the polyimide resin is preferred. In this embodiment, based on the total weight of the bio-based insulating layer, the content of the bio-based resin in the bio-based insulating layer is more than 0 to 100 wt. %, e.g., 5, 10, 15, 20, 25, 30, 35, 40, 45, 50, 55, 60, 65, 70, 75, 80, 85, 90, 95 or 100 wt. %, and the content of the petrochemical-based resin in the bio-based insulating layer is 0 to 80 wt. %, e.g., 0, 5, 10, 15, 20, 25, 30, 35, 40, 45, 50, 55, 60, 65, 70, 75 or 80 wt. %; based on the total weight of the bio-based adhesive layer, the content of the bio-based resin in the bio-based adhesive layer is more than 0 to 100 wt. %, e.g., 5, 10, 15, 20, 25, 30, 35, 40, 45, 50, 55, 60, 65, 70, 75, 80, 85, 90, 95 to 100 wt. %, and the content of the petrochemical-based resin in the bio-based adhesive layer is 0 to 80 wt. %, e.g., 0, 5, 10, 15, 20, 25, 30, 35, 40, 45, 50, 55, 60, 65, 70, 75 or 80 wt. %; and based on the total weight of the bio-based electrically conductive adhesive layer, the content of the bio-based resin in the bio-based electrically conductive adhesive layer is more than 0 to 95 wt. %, e.g., 5, 10, 15, 20, 25, 30, 35, 40, 45, 50, 55, 60, 65, 70, 75, 80, 85, 90 or 95 wt. %, and the content of the petrochemical-based resin in the bio-based electrically conductive adhesive layer is 0 to 70 wt. %, e.g., 0, 5, 10, 15, 20, 25, 30, 35, 40, 45, 50, 55, 60, 65 or 70 wt. %.

In an embodiment, the "polyimide resin" or "polyimide-based resin" in the bio-based insulating layer refers to a polyimide resin having an imide bond skeleton, also termed as a polyimide varnish. For example, but not limited to, the polyimide resin is at least one selected from the group consisting of polyimide (PI), polyamide-imide, and polyimide-ester.

In an embodiment, at least one of the bio-based insulating layer and the bio-based adhesive layer further comprises at least one inorganic powder selected from the group consisting of calcium sulfate, carbon black, silica, titania, zinc sulfide, zirconia, calcium carbonate, silicon carbide, boron nitride, alumina, talc, aluminum nitride, glass powder, quartz powder, and clay, and the inorganic powder has a particle size of 10 nm to 20 µm, e.g., 10 nm, 20 nm, 30 nm, 40 nm, 50 nm, 100 nm, 200 nm, 300 nm, 400 nm, 500 nm, 600 nm, 700 nm, 800 nm, 900 nm, 1 µm, 2 µm, 3 µm, 4 µm, 5 µm, 6 µm, 7 µm, 8µ, 9 µm, 10 µm, 11 microns, 12µ, 13 µm, 14 µm, 15 µm, 16 µm, 17 µm, 18 µm, 19 µm or 20 µm, to roughen the bio-based insulating layer and/or the bio-based adhesive layer. In this embodiment, based on the total weight of the bio-based insulating layer, the content of the inorganic powder in the bio-based insulating layer is more than 0 to 50 wt. %; and based on the total weight of the bio-based adhesive layer, the content of the inorganic powder in the bio-based adhesive layer is more than 0 to 50 wt. %. The contents of the inorganic powder in the bio-based insulating layer and the inorganic powder in the bio-based adhesive layer may be, e.g., 1, 2, 3, 4, 5, 10, 15, 20, 25, 30, 35, 40, 45 or 50 wt. %; wherein an additional proportion of more than 0 to 20 wt. % is preferred. Also, the silica of the present disclosure may be sintered silica. For example, but not limited to, based on the total weight of the bio-based insulating layer, the sum of the weights of sintered silica, carbon black, talc, calcium carbonate, glass powder, and quartz powder is more than 0 to 50 wt. %, and preferably more than 0 to 20 wt. %. In addition, for example, but not limited to, based on the total weight of the bio-based adhesive layer, the sum of the weights of sintered silica, carbon black, talc, calcium carbonate, glass powder, and quartz powder is more than 0 to 50 wt. %, and preferably more than 0 to 20 wt. %.

In an embodiment, at least one of the bio-based insulating layer and the bio-based adhesive layer further comprises at least one flame-retardant compound selected from the group consisting of a halogen-containing compound, a phosphor-containing compound, a nitrogen-containing compound, and a boron-containing compound. In this embodiment, based on the total weight of the bio-based insulating layer, the content of the flame retardant compound in the bio-based insulating layer is 1 to 40 wt. %, e.g., 1, 2, 3, 4, 5, 10, 15, 20, 25, 30, 35 or 40 wt. %; wherein an addition proportion of 5 to 35 wt. % is preferred. In this embodiment, based on the total weight of the bio-based adhesive layer, the content of the flame retardant compound is 1 to 50 wt. %, e.g., 1, 2, 3, 4, 5, 10, 15, 20, 25, 30, 35, 40, 45 or 50 wt. %; wherein an addition proportion of 5 to 35 wt. % is preferred.

In an embodiment, at least one of the bio-based insulating layer and the bio-based adhesive layer may further comprises an organic powder. In another embodiment, the bio-based adhesive layer may further comprise polytetrafluoroethylene or a fluorine resin different from polytetrafluoroethylene, which combined fluorine atom and carbon atom.

In an embodiment, at least one of the bio-based insulating layers and the bio-based adhesive layer comprises an inorganic and/or an organic pigment to form a colored layer with a non-natural color. In this embodiment, the inorganic pigment is at least one selected from the group consisting of cadmium red, lemon cadmium yellow, orange cadmium yellow, titania, carbon black, black iron oxide and complexed inorganic pigment, and the organic pigment is at least one selected from the group consisting of aniline black, paliogen black, anthraquinone black, benzidine-based yellow pigment, phthalocyanine blue and phthalocyanine green. In this embodiment, based on the total weight of the bio-based insulating layer, the content of the inorganic and/or organic pigment in the bio-based insulating layer is more than 0 to 50 wt. %, e.g., 0, 1, 2, 3, 4, 5, 10, 15, 20, 25, 30, 35, 40, 45 or 50 wt. %. In this embodiment, based on the total weight of the bio-based adhesive layer, the content of the inorganic and/or the organic pigment in the bio-based adhesive layer is more than 0 to 50 wt. %, e.g., 0, 1, 2, 3, 4, 5, 10, 15, 20, 25, 30, 35, 40, 45 or 50 wt. %.

In an embodiment, at least one of the bio-based insulating layer, the bio-based adhesive layer and the bio-based electrically conductive adhesive layer further comprises an additive which is at least one selected from curing agent, catalyst and surfactant; wherein based on the total weight of the bio-based insulating layer, the content of the additive in the bio-based insulating layer is more than 0 to 20 wt. %, e.g., 1, 2, 3, 4, 5, 10, 15 or 20 wt. %; based on the total weight of the bio-based adhesive layer, the content of the additive in the bio-based adhesive layer is more than 0 to 20 wt. %, e.g., 1, 2, 3, 4, 5, 10, 15 or 20 wt. %; and based on the total weight of the bio-based electrically conductive adhesive layer, the content of the additive in the bio-based electrically conductive adhesive layer is more than 0 to 10 wt. %, e.g., 1, 2, 3, 4, 5, 6, 7, 8, 9 or 10 wt. %.

In an embodiment, the bio-based insulating layer has a hardness of 2H to 6H.

In an embodiment, the bio-based resin is a bio-based polyamide-imide resin having imide bond (—C(O)—N(R)—C(O)—); wherein the bio-based polyamide-imide resin at least comprises the constituent unit represented by the formula (I) below:

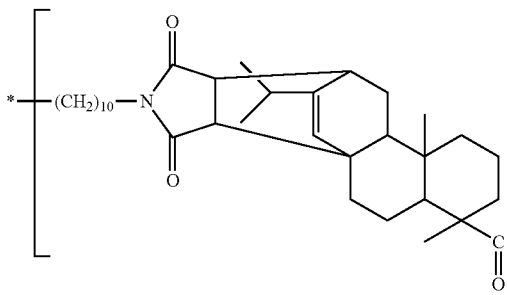
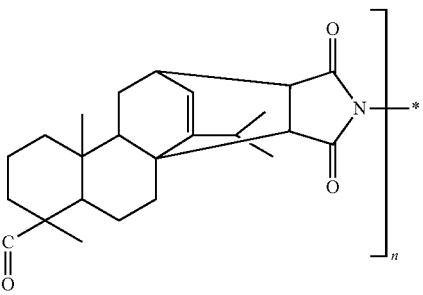

in formula (I), n is 20 to 35.

In an embodiment, the petrochemical-based resin is a petrochemical-based polyamide-imide resin; wherein the petrochemical-based polyamide-imide resin at least comprises the constituent unit represented by the formula (II) below:

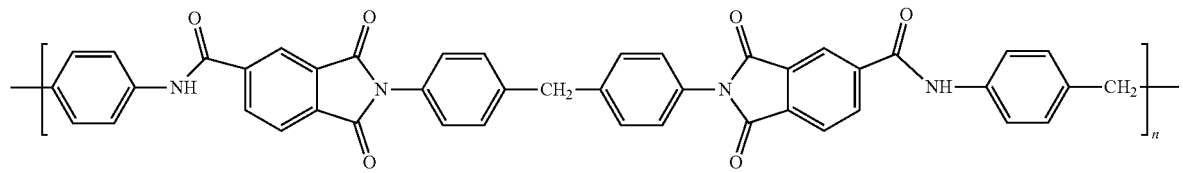

n = 25

In another embodiment, the petrochemical-based resin is selected from a bisphenol A epoxy resin, an acrylic resin, or a combination of a bisphenol A epoxy resin and an acrylic resin mixed at a weight ratio of 1:1.

In an embodiment, the additive is a curing agent and the additive can be, e.g., 4,4'-diaminodiphenylsulfone.

In an embodiment, the plated metal layer is copper foil layer, silver foil layer, aluminum foil layer or nickel foil layer having a thickness of 0.1 to 5 µm. In this embodiment, the plated metal layer has a thickness of, e.g., 0.1, 0.2, 0.3, 0.4, 0.5, 0.6, 0.7, 0.8, 0.9, 1, 1.5, 2, 2.5, 3, 3.5, 4, 4.5 or 5 µm.

In another embodiment, the porous metal layer has a thickness of 2 to 15 µm and has a pore size of 5 µm to 25 µm, a porosity of 15% to 30%, a tensile strength more than or equal to 20 kgf/mm2, and an elongation rate more than or equal to 5%. In this embodiment, the porous metal layer has a thickness of, e.g., 2, 3, 4, 5, 6, 7, 8, 9, 10, 11, 12, 13, 14 or 15 µm; the porous metal layer has a pore size of, e.g., 5, 6, 7, 8, 9, 10, 11, 12, 13, 14, 15, 16, 17, 18, 19, 20, 21, 22, 23, 24 or 25 µm; and the porous metal layer has a porosity of, e.g., 15, 16, 17, 18, 19, 20, 21, 22, 23, 24, 25, 26, 17, 28, 29 or 30%.

In an embodiment, the bio-based electrically conductive adhesive layer is single-layer bio-based electrically conductive adhesive layer having a plurality of electrically conductive particles. In this embodiment, the material forming the plurality of electrically conductive particles is at least one selected from the group consisting of copper, silver, nickel, tin, gold, palladium, aluminum, chromium, titanium, zinc, carbon and alloys thereof. In a preferred embodiment, the alloy is at least one selected from the group consisting of nickel-gold alloy, gold-silver alloy, copper-nickel alloy, copper-silver alloy, nickel-silver alloy and copper-nickel-gold alloy. In this embodiment, based on the total weight of the bio-based electrically conductive adhesive layer, the content of the plurality of electrically conductive particles is 5 to 85 wt. %, e.g., 5, 10, 15, 20, 25, 30, 35, 40, 45, 50, 55, 60, 65, 70, 75, 80 or 85 wt. %.

In another embodiment, the bio-based electrically conductive adhesive layer has a double-layer structure and is formed by laminating an adhesive layer without electrically conductive particles and an electrically conductive adhesive layer having a plurality of electrically conductive particles; wherein the adhesive layer without electrically conductive particle is adherent between the metal layer and the electrically conductive adhesive layer having a plurality of electrically conductive particles, and the metal layer is a porous metal layer. In this embodiment, based on the total weight of the electrically conductive adhesive layer, the content of the plurality of electrically conductive particles in the electrically conductive adhesive layer is 5 to 85 wt. %, e.g., 5, 10, 15, 20, 25, 30, 35, 40, 45, 50, 55, 60, 65, 70, 75, 80 or 85 wt. %.

In an embodiment, the bio-based insulating layer has a thickness of 2 to 50 µm; the bio-based adhesive layer has a thickness of 2 to 50 µm, e.g., 2, 3, 4, 5, 6, 7, 8, 9, 10, 15, 20, 25, 30, 35, 40, 45 or 50 µm; the plated metal layer has a thickness of 0.1 to 5 µm, e.g., 0.1, 0.2, 0.3, 0.4, 0.5, 0.6, 0.7, 0.8, 0.9, 1, 1.5, 2, 2.5, 3, 3.5, 4, 4.5 or 5 µm; and the bio-based electrically conductive adhesive layer has a thickness of 3 to 50 µm, e.g., 3, 4, 5, 6, 7, 8, 9, 10, 15, 20, 25, 30, 35, 40, 45 or 50 µm.

In an embodiment, the bio-based insulating layer has a thickness of 2 to 50 µm; the bio-based adhesive layer has a thickness of 2 to 50 µm, e.g., 2, 3, 4, 5, 6, 7, 8, 9, 10, 15, 20, 25, 30, 35, 40, 45 or 50 µm; the porous metal layer has a thickness of 2 to 15 µm, e.g., 2, 3, 4, 5, 6, 7, 8, 9, 10, 11, 12, 13, 14 or 15 µm; and the bio-based electrically conductive adhesive layer has a thickness of 3 to 50 µm, e.g., 3, 4, 5, 6, 7, 8, 9, 10, 15, 20, 25, 30, 35, 40, 45 or 50 µm.

In another embodiment, the bio-based insulating layer has a thickness of 3 to 10 µm; the bio-based adhesive layer has a thickness of 3 to 10 µm, e.g., 3, 4, 5, 6, 7, 8, 9 or 10 µm; the porous metal layer has a thickness of 3 to 8 µm, e.g., 3, 4, 5, 6, 7 or 8 µm; and the bio-based electrically conductive adhesive layer has a thickness of 5 to 50 µm, e.g., 5, 6, 7, 8, 9, 10, 15, 20, 25, 30, 35, 40, 45 or 50 µm.

In an embodiment, the support layer is a support film or a release film with a thickness of 12.5 to 250 µm, e.g., 12.5, 13, 14, 15, 20, 40, 60, 80, 100, 120, 140, 160, 180, 200, 220, 240, 245 or 250 µm.

In an embodiment, the matte-type electromagnetic interference shielding film comprising bio-based component further comprises a release layer which is formed on the bio-based electrically conductive adhesive layer, allowing the bio-based electrically conductive adhesive layer to be located between the metal layer and the release layer. In an example, the release layer is a release film with a thickness of 25 to 100 µm, e.g., 25, 30, 35, 40, 45, 50, 55, 60, 65, 70, 75, 80, 85, 90, 95 or 100 µm, and the release film is at least one selected from the group consisting of PET fluoroplastic release film, silicone PET release film, matte PET release film and PE release film. In another example, the release layer is a PE-coated paper with a thickness of 25 to 130 µm, e.g., 25, 30, 35, 40, 45, 50, 55, 60, 65, 70, 75, 80, 85, 90, 95, 100, 110, 120 or 130 µm. In another example, the release layer is a carrier film with a thickness of 25 to 100 µm, e.g., 25, 30, 35, 40, 45, 50, 55, 60, 65, 70, 75, 80, 85, 90, 95 or 100 µm, and the carrier film is a carrier film with low adhesiveness.

In an embodiment, the preparation method of a matte-type electromagnetic interference shielding film comprising bio-based component is used for the preparation of a shielding film having a plated metal layer, which comprises the following steps:

S101, after forming a bio-based insulating layer on a support layer, curing the bio-based insulating layer under a condition of 50° C. to 180° C.;

S102, forming a plated metal layer on the bio-based insulating layer by using one of the selected from vacuum sputtering, evaporation deposition, chemical plating and electroplating;

S103, forming a bio-based electrically conductive adhesive layer on the plated metal layer, allowing the plated metal layer to be located between the bio-based insulating layer and the bio-based electrically conductive adhesive layer; and S104, laminating a release layer on the bio-based electrically conductive adhesive layer.

In this embodiment, the preparation method may further comprise the following steps:

S1011, prior to forming the bio-based plated metal layer, forming another bio-based insulating layer on the bio-based insulating layer and curing said another bio-based insulating layer under a condition of 50° C. to 180° C., then forming the bio-based plated metal layer, allowing the plated metal layer to be located between said another bio-based insulating layer and the bio-based electrically conductive adhesive layer; and S1012, prior to forming the plated metal layer, forming a bio-based adhesive layer on the bio-based insulating layer or said another bio-based insulating layer by using a coating method or a transfer method, then forming the plated metal layer, allowing the plated metal layer to be located between the bio-based adhesive layer and the bio-based electrically conductive adhesive layer.

In another embodiment, the present disclosure also provides another preparation method of a matte-type electromagnetic interference shielding film comprising bio-based component is used for preparation of a shielding film having a porous metal layer, which comprises the following steps:

S201, after forming a bio-based insulating layer on a support layer, curing the bio-based insulating layer under a condition of 50° C. to 180° C.;

S202, forming a bio-based adhesive layer on the porous metal layer by using a coating method or a transfer method;

S203, contacting and laminating the bio-based insulating layer and the bio-based adhesive layer, allowing the bio-based adhesive layer to be located between the bio-based insulating layer and the porous metal layer;

S204, forming a bio-based electrically conductive adhesive layer on the porous metal layer; and S205, laminating a release layer on the bio-based electrically conductive adhesive layer.

In this embodiment, the preparation method may further comprise the following steps:

S2011, posterior to curing the bio-based insulating layer, forming another bio-based insulating layer on the bio-based insulating layer, and curing said another bio-based insulating layer under a condition of 50° C. to 180° C.

Further, in this embodiment, the preparation method of the porous metal layer comprises the following steps:

S2012, coating an aluminum layer on a thin film;

S2013, performing a release treatment of the surface of the aluminum layer;

S2014, forming a metal layer on the release-treated surface of the aluminum layer by using one of the selected from sputtering, evaporation deposition and aqueous plating (e.g., chemical plating and electroplating);

S2015, performing a micro-etching treatment on the metal layer to form a plurality of pores; and S2016, peeling off the thin film and the aluminum layer, allowing the metal layer to be a porous metal layer.

In this embodiment, the thin film is polyimide film or ethylene terephthalate film; the metal particle in the metal layer is at least one selected from the group consisting of copper, aluminum, lead, nickel, cobalt, tin, silver, iron, and gold.

EXAMPLES

The performances of the matte-type electromagnetic interference shielding film comprising bio-based components of the present disclosure will be described through Examples and Comparative Examples below. In addition, the concept described herein will be further set forth in the following Examples which do not limit the scope of the present disclosure described in Claims.

Examples A1 to A9 and B1 to B8 are matte-type electromagnetic interference shielding films comprising bio-based components of the present disclosure.

Materials and components used in Examples of the present disclosure were shown in Table 1 below.

TABLE 1

| Composition for each layer | | Ex. A1 | Ex. A2 | Ex. A3 | Ex. A4 | Ex. A5 | Ex. A6 | Ex. A7 | Ex. A8 | Ex. A9 |
|---|---|---|---|---|---|---|---|---|---|---|
| Bio-based insulating layer/ First bio-based insulating sublayer | Bio-based resin: R-1 | 70 | 70 | 80 | 80 | 70 | 70 | 80 | 70 | 70 |
| | petrochemical-based resin: R-2 | 10 | 10 | 0 | 0 | 10 | 10 | 0 | 10 | 10 |
| | Inorganic filler: SiO$_2$ | 5 | 5 | 5 | 5 | 5 | 5 | 5 | 5 | 5 |
| | Inorganic pigment: carbon black | 10 | 10 | 10 | 10 | 10 | 10 | 10 | 10 | 10 |
| | Additive: DDS | 5 | 5 | 5 | 5 | 5 | 5 | 5 | 5 | 5 |
| Second bio-based insulating sublayer | Bio-based resin: R-1 | 50 | 50 | — | — | 50 | 50 | — | 30 | 30 |
| | petrochemical-based resin: R-2 | 40 | 40 | — | — | 40 | 40 | — | 35 | 35 |
| | Inorganic filler: SiO$_2$ | 5 | 5 | — | — | 5 | 5 | — | 5 | 5 |
| | Inorganic pigment: carbon black | 0 | 0 | — | — | 0 | 0 | — | 25 | 25 |
| | Additive: DDS | 5 | 5 | — | — | 5 | 5 | — | 5 | 5 |
| Bio-based adhesive layer | Bio-based resin: R-1 | 30 | 30 | 30 | 30 | 30 | 30 | 30 | — | — |
| | petrochemical-based resin: R-3 | 25 | 25 | 25 | 25 | 25 | 25 | 25 | — | — |
| | Flame retardant: Exolit OP 935 - Clariant | 30 | 30 | 30 | 30 | 30 | 30 | 30 | — | — |
| | Inorganic pigment: carbon black | 0 | 0 | 0 | 0 | 0 | 0 | 0 | — | — |
| | Additive: DDS | 15 | 15 | 15 | 15 | 15 | 15 | 15 | — | — |
| Bio-based electrically conductive adhesive layer | Bio-based resin: R-1 | 25 | 25 | 25 | 25 | 25 | 25 | 25 | 25 | 25 |
| | petrochemical-based resin: R-4 | 50 | 50 | 50 | 50 | 50 | 50 | 50 | 50 | 50 |
| | Electrically conductive particles: nickel, silver, copper metal particles | 15 | 15 | 15 | 15 | 15 | 15 | 15 | 15 | 15 |
| | Additive: DDS | 10 | 10 | 10 | 10 | 10 | 10 | 10 | 10 | 10 |
| Total bio-based content in the shielding film | | 34 | 30 | 38 | 34 | 40 | 40 | 45 | 32 | 28 |

In the Table above, R-1, R-2, R-3, R-4 and DDS are shown as follows, respectively:

(1) Bio-based resin R-1

A polyamide-imide varnish was used. In particular, it is a bio-based resin having imide bond (—C(O)—N(R)—C(O)—) formed by a synthesis reaction of bio-based di-anhydride and bio-based di-amine extracted or obtained from natural animals and plants as precursor monomers in furthered added cyclohexanone as a solvent. The bio-based polyamide-imide resin contains at least constituent units of formula (I) below, wherein the n in the formula (I) is 20 to 35.

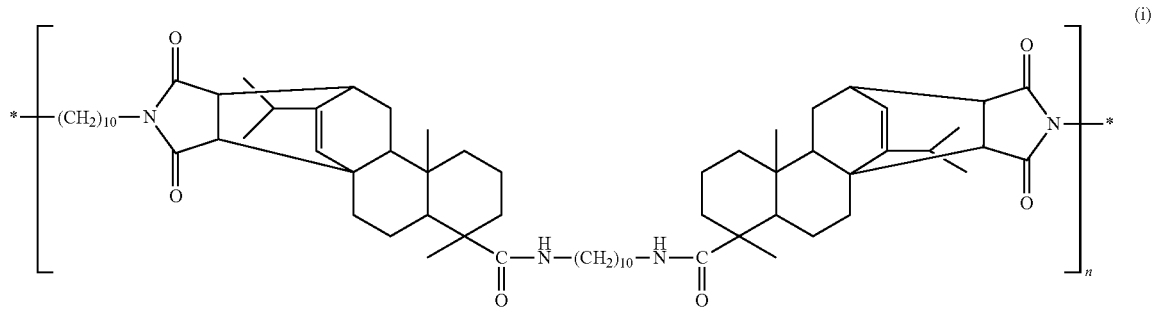

(i)

(2) Petrochemical-based resin R-2

A petroleum product, polyamide-imide, was used. In particular, it is a petrochemical-based resin formed by a synthesis reaction of precursor monomers extracted or obtained from a petroleum product. The petrochemical-based polyamide-imide resin contains at least constituent units of formula (II) below.

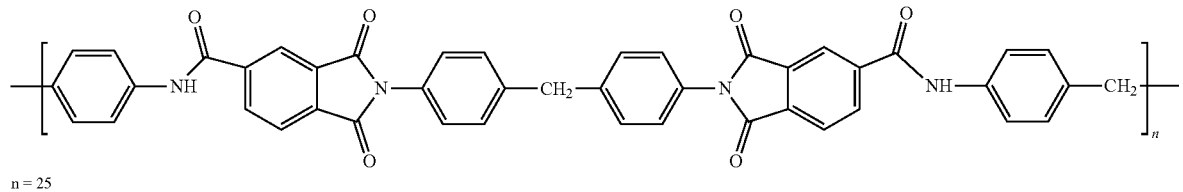

n = 25

(3) petrochemical-based resin R-3: Bisphenol A epoxy resin BE501A80 (purchased from Chang Chun Chemicals) was used.

(4) petrochemical-based resin R-4: Formed by mixing bisphenol A epoxy resin BE501A80 (purchased from Chang Chun Chemicals) and acrylic resin JT-A1767 (purchased from JPT Corporation) at a weight ratio of 1:1.

(5) Additive DDS: 4,4'-diaminodiphenylsulfone, which was used as a curing agent.

The thickness of each layer in the shielding films of the Examples and the Comparative Examples of the present disclosure were shown in Table 2 below.

TABLE 2

| | Ex. A1 | Ex. A2 | Ex. A3 | Ex. A4 | Ex. A5 | Ex. A6 | Ex. A7 | Ex. A8 | Ex. A9 | Comp. Ex. 1 | Comp. Ex. 2 | Comp. Ex. 3 |
|---|---|---|---|---|---|---|---|---|---|---|---|---|
| Thickness of the insulating layer (μm)/ Thickness of the first insulating sublaye (μm) | 3 | 3 | 5 | 5 | 3 | 3 | 5 | 2 | 2 | 10 | 12 | 5 |
| Thickness of the second insulating sublaye (μm) | 3 | 3 | — | — | 3 | 3 | — | 5 | 5 | — | — | — |
| Thickness of the adhesive layer (μm)/ | 5 | 5 | 5 | 5 | 5 | 5 | 5 | — | — | 5 | 5 | 5 |
| Thickness of the metal layer (μm)/ | 3 | 5 | 3 | 5 | 0.2 | 0.6 | 0.2 | 1 | 3 | 1 | 7 | 3 |
| Thickness of the electrically conductive adhesive layer (μm)/ | 5 | 5 | 5 | 5 | 5 | 5 | 5 | 5 | 5 | 5 | 5 | 5 |
| Total thickness after lamiantion (μm) | 19 | 21 | 18 | 20 | 16 | 16 | 15 | 13 | 15 | 21 | 29 | 18 |

The shielding films of the examples of the present disclosure were prepared as follows:

Examples A1 and A2

Matte-type electromagnetic interference shielding films comprising bio-based component was prepared according to the component content of each layer of Examples A1 and A2 shown in Table 1 and the thickness of each layer of Examples A1 and A2 shown in Table 2, the shielding films include a bio-based insulating layer (which comprises two bio-based insulating sublayers), a bio-based adhesive layer, a metal layer (which is a porous metal layer) and a bio-based electrically conductive adhesive layer. The specific preparation method was stated as follows.

Firstly, a polyamide-imide varnish was coated on a support film with a thickness of 50 μm and was cured in a floating coating oven using low-temperature curing of a temperature procedure of heating at a temperature between 50 and 180° C. for 10 minutes (generally heating for 3 to 10 minutes) to form a first bio-based insulating sublayer; thereafter, a polyamide-imide varnish was coated on the surface of the first bio-based insulating sublayer and was cured in a floating coating oven using low temperature curing of a temperature procedure of heating at a temperature between 5° and 180° C. for 10 minutes (generally heating for 3 to 10 minutes) to form a second bio-based insulating sublayer.

Secondly, a porous metal layer was pre-prepared, which is a porous copper foil metal layer. A thin film and an aluminum wire were placed in a furnace evaporator and subjected to evaporation by heating to 1700° C. under high vacuum conditions to deposit an aluminum layer of 400 nm thick. A release treatment was performed on the surface of the aluminum layer, then a copper foil metal layer was formed on the surface of the release-treated aluminum layer by sputtering, and the copper foil metal layer was chemically micro-etched to form a plurality of pores. Finally, the thin film and the aluminum layer were peeled off to allow the copper foil metal layer to form a porous copper foil metal layer, wherein the porous copper foil metal layer has pores with diameters of 1 to 20 μm and has a porosity of 25±2%, a tensile strength of 22 kgf/mm$^2$ and an elongation rate of 6%.

Then, a bio-based adhesive layer was formed on the porous copper foil metal layer by a transfer method, and the bio-based insulating layer was contact-laminated on the bio-based adhesive layer to allow the bio-based adhesive layer to be located between the bio-based insulating layer and the porous metal layer. Thereafter, a bio-based electrically conductive adhesive layer was coated on the porous metal layer. Finally, a CA-0700 release film (purchased from NAN YA) was laminated on the bio-based electrically conductive adhesive layer, wherein the laminating process was performed at a temperature of 60° C. under a pressure of 2 kgf.

Examples A3 and A4

Matte-type electromagnetic interference shielding films comprising bio-based component was prepared according to the component content of each layer of Examples A3 and A4 shown in Table 1 and the thickness of each layer of Examples A3 and A4 shown in Table 2, the shielding films include a bio-based insulating layer (which comprises no insulating sublayer), a bio-based adhesive layer, a metal layer (which is a porous metal layer) and a bio-based electrically conductive adhesive layer.

The preparation method was the same as Examples A1 and A2, except the two bio-based insulating sublayers were adjusted to one bio-based insulating layer.

Examples A5 and A6

Matte-type electromagnetic interference shielding films comprising bio-based component was prepared according to the component content of each layer of Examples A5 and A6 shown in Table 1 and the thickness of each layer of Examples A5 and A6 shown in Table 2, the shielding films include a bio-based insulating layer (which comprises two bio-based insulating sublayers), a bio-based adhesive layer, a metal layer (which is a plated metal layer) and a bio-based electrically conductive adhesive layer. The specific preparation method was stated as follows.

Firstly, a polyamide-imide varnish was coated on a support film with a thickness of 50 μm and was cured in a floating coating oven using low-temperature curing of a temperature procedure of heating at a temperature between 5° and 180° C. for 10 minutes (generally heating for 3 to 10 minutes) to form a first bio-based insulating sublayer; thereafter, a polyamide-imide varnish was coated on the surface of the first bio-based insulating sublayer and was cured in a floating coating oven using low temperature curing of a temperature procedure of heating at a temperature between 5° and 180° C. for 10 minutes (generally heating for 3 to 10 minutes) to form a second bio-based insulating sublayer. In addition, carbon black was added to the first bio-based insulating sublayer at a proportion of 10%, based on the total weight of the first bio-based insulating sublayer, and there was no carbon black added to the second bio-based insulating sublayer. Thereafter, a bio-based adhesive layer was formed on the second bio-based insulating sublayer by a coating method.

Thereafter, a plated metal layer was formed on the bio-based adhesive layer by an evaporation deposition in combination with a chemical plating. The plated metal layer was a copper-plated metal layer, wherein the evaporation deposition was performed at a power parameter of 10 to 50 KW, a gas flow rate of 100 to 500 SCCM, and a linear velocity of 3 to 10 m/min; and the chemical plating was performed at a current density of 5 to 100 A/dm² (ASD) and a linear velocity of 3 to 10 m/min.

Finally, a bio-based electrically conductive adhesive layer was coated on the opposite other side of the copper plated metal layer; and a CA-0700 release layer (purchased from NAN YA) was laminated on the opposite other side of the bio-based electrically conductive adhesive layer, wherein the laminating process was performed at a temperature of 60° C. under a pressure of 2 kgf.

Examples A7

Matte-type electromagnetic interference shielding film comprising bio-based component was prepared according to the component content of each layer of Example A7 shown in Table 1 and the thickness of each layer of Example A7 shown in Table 2, the shielding film includes a bio-based insulating layer (which comprises no bio-based insulating sublayer), a bio-based adhesive layer, a metal layer (which is a plated metal layer) and a bio-based electrically conductive adhesive layer.

The preparation method was the same as Examples A5 and A6, except the two bio-based insulating sublayers were adjusted to one bio-based insulating layer.

Examples A8 and A9

Matte-type electromagnetic interference shielding films comprising a bio-based component was prepared according to the component content of each layer of Examples A8 and A9 shown in Table 1 and the thickness of each layer of Examples A8 and A9 shown in Table 2, the shielding films include a bio-based insulating layer (which comprises two bio-based insulating sublayers), a metal layer (which is a plated metal layer) and a bio-based electrically conductive adhesive layer.

The preparation method was the same as Examples A5 and A6, except that no bio-based adhesive layer was included and there were cracks and/or defects in the plated metal layer.

Comparative Example 1

A available high-frequency shielding film with a high shielding performance comprising no bio-based component and containing a conventional metal layer was used, the thickness of each layer in which was shown in Table 2, wherein the insulating layer in Comparative Example 1 was polyurethane ink.

Comparative Example 2

A high-frequency shielding film with a high shielding performance comprising no bio-based component and containing a conventional metal layer was used, the thickness of each layer in which was shown in Table 2, wherein the insulating layer in Comparative Example 2 was Kapton black polyimide film (purchased from DuPont).

Comparative Example 3

A high-frequency shielding film with a high shielding performance comprising no bio-based component and containing a conventional metal layer was used, the thickness of each layer in which was shown in Table 2, wherein the insulating layer in Comparative Example 3 was Kapton black polyimide film (purchased from DuPont).

In addition, the metal layers in Comparative Examples 1 to 3 were all conventional copper foil layers without microetching treatment. The components and contents of the adhesive layers and the electrically conductive adhesive layers of Comparative Examples 1 to 3 were all shown in Table 1, except that petrochemical-based resins were used to replace the bio-based resins.

Table 3 showed test results of Examples A1 to A9 and Comparative Examples 1 to 3, including Gloss values, resistance values, insulation resistance values, peeling strengths, hardness, shielding performances, solder heat resistance, Simulated client SMT, etc.

Test Methods

1. Porosity Test: the porosity of the porous metal layer was calculated from the following equation:

$$\theta = \left(1 - \frac{M}{V\rho s}\right) \times 100\%$$

in the equation, M was the mass of sample (g), V was the volume of sample (cm3) and ρs was the density of the dense solid material corresponding to the porous sample (g/cm3).

2. Tensile Strength Test: the test was performed according to IPC-TM-650 2.4.19 C (May 1998).

3. Elongation rate Test: the test was performed according to IPC-TM-650 2.4.19 C (May 1998).

4. Peeling Strength Test: the test was performed on the surface of the electrically conductive adhesive of the sample according to IPC-TM-650 2.4.9 D.

5. Soldering heat resistance Test: the test was performed according to IPC-TM-650 2.4.13 F.

6. Surface Hardness Test: the test was performed by a pencil on the surface of the insulating layer or the first insulating sublayer of the sample according to ASTM D3363.

7. Electromagnetic Shielding Performance Test: the test was performed according to GB/T 30142-2013 "Measuring methods for shielding effectiveness of planar electromagnetic shielding materials".

8. Gloss Value Test: a sample with a size larger than 3 cm×8 cm was prepared and measured in the longitudinal direction (MD) of the surface of the insulating layer of the sample using a gloss meter, with the value read at 60° as the measurement value.

9. Insulating Resistance Test: the insulating resistance test was performed on a semi-finished shielding film without the plated metal layer, wherein the semi-finished shielding film had an insulating layer and an adhesive layer only. Firstly, the semi-finished shielding film was cut into A4 size, and an electrodeposited copper foil of 1 oz thick was taken and coated with an epoxy resin glue on its gloss surface. The electrodeposited copper foil coated with the epoxy resin glue was laminated on the cut semi-finished film by a manner of lamination fast compression to form a stacking structure of insulating layer/adhesive layer/epoxy resin glue/electrodeposited copper foil which was then aged at a temperature of 160° C. for 1 hr to give the test sample. Then, the insulating layer of the test sample was measured at positions at left, center, and right with an ohmmeter, and an average result was obtained from the 3 sets of data described above.

10. Resistance Value Test: the resistance value of a circuit sample was measured with the Ohm ranges of a digital multimeter. 8 circuit samples with the length 6 cm (TD)× width of 0.8 cm (MD) were arranged in a linear manner and numbered from 1 to 8. Each of the 8 circuit samples had a point with a pore size of 1.0 mm. The interval between the two points was 1 cm with the interval between the points in Sample 1 and Sample 8 was 7 cm. Two points along the MD were grouped (No. 1-No. 2, No. 1-No. 3, No. 1-No. 4 . . . . No. 1-No. 8) for testing. 7 sets of values were measured and their average results were recorded in Table 1.

11. Bio-based Content Test: USDA Certification, Test Method: the ratio of the bio-based derived carbon to the petrochemical-based derived carbon was measured by the 14C Measurement of Criterion ASTM D6866-12. In particular, % Bio-content=[Bio(Organic)Carbon]/[Total (Organic) Carbon]*100%.

12. Client SMT Simulation Test: Ramping at 2° C./sec to 120° C., then pre-heating for 2 minutes, ramping at 3° C./sec to 245° C., maintaining for 0.5 minutes, cooling at 4° C./sec to room temperature, and then taking out to confirm if the appearance has been popcorn.

13. Surface Roughness Test: Performed using an Atomic Force Microscope (AFM) and according to the JIS-B0601.

14. Release force test: Performed using a tension testing machine and according to the ASTM D3330.

TABLE 3

| ITEM | Ex. A1 | Ex. A2 | Ex. A3 | Ex. A4 | Ex. A5 | Ex. A6 | Ex. A7 | Ex. A8 | Ex. A9 | Comp. Ex. 1 | Comp. Ex. 2 | Comp. Ex. 3 |
|---|---|---|---|---|---|---|---|---|---|---|---|---|
| Gloss value (GU) | 13 | 13 | 16 | 16 | 13 | 13 | 16 | 15 | 15 | 29 | 37 | 111 |
| Resistance value (Ω) 70 mm spacing Aperture 1.0 mm | 0.4 | 0.3 | 0.2 | 0.2 | 0.4 | 0.3 | 0.2 | 0.3 | 0.2 | 0.2 | 0.3 | 0.5 |
| Insulation resistance value >$10^{12}\Omega$ | PASS | PASS | PASS | PASS | PASS | PASS | PASS | PASS | PASS | NG | PASS | PASS |
| Peeling strength of the electrically conductive adhesive (kgf/cm) | 1.48 | 1.52 | 1.43 | 1.39 | 1.48 | 1.52 | 1.43 | 1.44 | 1.39 | 1.48 | 1.59 | 1.37 |
| Surface hardness | 2H | 2H | 2H | 2H | 2H | 2H | 2H | 3H | 3H | HB | 2H | 2H |
| EMI shielding performance at 1 GHz (dB) | 78 | 80 | 79 | 80 | 64 | 71 | 62 | 77 | 85 | 70 | 90 | 75 |
| EMI shielding performance at 1 GHz (dB) at 85° C. and 85% relative humidity after 100 hrs | 73 | 76 | 76 | 77 | 59 | 63 | 58 | 73 | 80 | 61 | 85 | 70 |

TABLE 3-continued

| ITEM | Ex. A1 | Ex. A2 | Ex. A3 | Ex. A4 | Ex. A5 | Ex. A6 | Ex. A7 | Ex. A8 | Ex. A9 | Comp. Ex. 1 | Comp. Ex. 2 | Comp. Ex. 3 |
|---|---|---|---|---|---|---|---|---|---|---|---|---|
| Solder heat resistance | 320° C./60 sec | 320° C./50 sec | 320° C./40 sec | 310° C./60 sec | 310° C./10 sec | 300° C./50 sec | 310° C./10 sec | 300° C./30 sec | 288° C./60 sec | 280° C./30 sec | 240° C./10 sec | 260° C./10 sec |
| Simulated client SMT | PASS | PASS | PASS | PASS | PASS | PASS | PASS | PASS | PASS | PASS | NG | NG |

It could be seen from the test comparison results of Table 3 that the present matter-type electromagnetic interference shielding film comprising bio-based components had good related properties. In particular, compared to the shielding films comprising no bio-based component and using a metal layer without micro-etching treatment of Comparative Examples 1 to 3, among the shielding films comprising bio-based components of the present Examples A1 to A9, regardless of the shielding films using porous metal layers of Examples A1 to A4, the shielding films using plated metal layers without cracks and/or defects of Examples A5 to A7, or the shielding films using plated metal layers with cracks and/or defects and having a larger thickness of Examples A8 and A9, had electromagnetic shielding performance, client SMT simulation test, post-SMT on-resistance, weather resistance, etc. all better than existing shielding films, and thus could effectively meet the special requirements for client processes. In addition, due to the composition design of the insulating layer, the electrically conductive adhesive layer and the adhesive layer, the overall bio-based content was more than 20% of actual biomass content in both assays per the JORA Certification and the USDA Certification, and thus can be certified as bio-based plastics by various countries. Further, the insulating layers in the shielding films of Comparative Examples 1 to 3 had the surface hardness of HB to 2H, suggesting that the surfaces were frail and easy to be scratched. While the bio-based insulating layers/first insulating sublayers of the shielding films of the present Examples A1 to A7 had the surface hardness of 2H and the bio-based first insulating sublayers of the shielding films of the present Examples A8 and A9 had surface hardness even of 3H, thereby excellent appearances and mechanical performances were achieved.

Examples B1 to B8

The matte-type electromagnetic interference shielding films comprising bio-based components of Examples B1 to B8 had the same component contents for each layer, thickness for each layer and preparation method as Example A9, except that the addition proportion for carbon black into each of the bio-based insulating sublayers and the support films was adjusted as shown in Table 4 below.

Comparative Example 4

The matte-type electromagnetic interference shielding film comprising bio-based component of Comparative Example 4 was the same as that of Comparative Example 1, except the insulating layers thereof were structures each having two insulating sublayers and the addition proportions for carbon black into the insulating sublayers and the support film were shown in Table 4 below.

TABLE 4

| | First insulating sublayer | Second insulating sublayer | Support film | First surface Roughness (Rz) μm | Second surface Roughness (Rz) μm | Release force from support layer g/5 cm | Simulated client SMT |
|---|---|---|---|---|---|---|---|
| | Addition proportion of carbon black (Based on the total weight of each layer) | | | | | | |
| Ex. B1 | 5% | 5% | 10% | 0.61 | 0.61 | 64 | NG |
| Ex. B2 | 5% | 5% | 10% | 0.64 | 0.65 | 51 | NG |
| Ex. B3 | 5% | 20% | 10% | 0.64 | 3.89 | 39 | PASS |
| Ex. B4 | 5% | 25% | 10% | 0.63 | 4.97 | 26 | PASS |
| Ex. B5 | 10% | 20% | 10% | 1.48 | 3.95 | 24 | PASS |
| Ex. B6 | 10% | 25% | 10% | 1.44 | 4.75 | 27 | PASS |
| Ex. B7 | 15% | 25% | 10% | 1.94 | 4.97 | 13 | PASS |
| Ex. B8 | 15% | 40% | 10% | 2.03 | 7.95 | 17 | PASS |
| Comp. Ex. 4 | 0% | 0% | 10% | 0.03 | 0.05 | >500 N/A | NG |

In the above Table, the first surface roughness referred to the roughness of the surface of the first insulating layer facing towards the support film, and the second surface roughness referred to the roughness of the surface of the second insulating layer facing towards the metal layer.

It can be seen from the test comparison results in Table 4, the matte-type electromagnetic interference shielding films with the different surface roughness of Examples B3 to B8 of the present disclosure had good results of client SMT simulated test compared to the shielding film of Comparative Example 4. In addition, compared to the shielding film of Comparative Example 4, the films of Examples B1 to B8 of the present disclosure all had excellent release force from a support film.

What is claimed is:

1. A matte-type electromagnetic interference shielding film, comprising bio-based components, comprising:
    a bio-based electrically conductive adhesive layer with a thickness of 3 to 50 μm and containing a bio-based resin and a petrochemical-based resin;

a metal layer having a thickness of 0.1 to 15 μm, which is a plated metal layer and is formed on the bio-based electrically conductive adhesive layer; and a bio-based insulating layer containing a bio-based resin and a petrochemical-based resin with a thickness of 2 to 50 μm, which is formed on the metal layer, allowing the metal layer to be located between the bio-based insulating layer and the bio-based electrically conductive adhesive layer, wherein the bio-based insulating layer has a first surface and a second surface being opposite to the first surface and facing towards the metal layer, and the first surface and the second surface have different surface roughness Rz which are between 0.001 and 10 μm;

wherein the matte-type electromagnetic interference shielding film contains a bio-based content of 20-100%, by the ratio of the biomass-derived carbon to the petroleum-derived carbon, according to ASTM D6866-12, wherein the bio-based resin and the petrochemical-based resin in each of the bio-based insulating layer and the bio-based electrically conductive adhesive layer are each independently at least one selected from the group consisting of acrylic resin, polyurethane, urethane resin, silastic resin, poly-p-xylene resin, bismaleimide resin, styrene-ethylene-butene-styrene block copolymer, polyimide resin and polyamide-imide.

2. The matte-type electromagnetic interference shielding film comprising bio-based component of claim 1, further comprises a bio-based adhesive layer comprising a bio-based resin and a petrochemical-based resin with a thickness of 2 to 50 μm, which is formed on the metal layer, allowing the metal layer to be located between the bio-based adhesive layer and the bio-based electrically conductive adhesive layer.

3. The matte-type electromagnetic interference shielding film comprising bio-based component of claim 1 or 2, further comprises a support layer with a thickness of 12.5 to 250 μm, which is formed on the first surface of the bio-based insulating layer, allowing the first surface of the bio-based insulating layer has a gloss of 0 to 60 GU at a measuring angle of 60° after the support layer is peeled off;

wherein the material forming the support layer comprises an inorganic powder and at least one selected from the group consisting of polypropylene, polyethylene terephthalate, polyimide, polyphenylene sulfide, polyethylene naphthalate, polyurethane and polyamide, wherein the polypropylene is biaxially oriented polypropylene;

wherein the inorganic powder is at least one selected from the group consisting of calcium sulfate, carbon black, silica, titania, zinc sulfide, zirconia, calcium carbonate, silicon carbide, boron nitride, alumina, talc, aluminum nitride, glass powder, quartz powder and clay, and the inorganic powder in the support layer has a particle size of 10 nm to 20 μm.

4. The matte-type electromagnetic interference shielding film comprising bio-based component of claim 2, wherein the bio-based resin and the petrochemical-based resin in the bio-based adhesive layer are each independently at least one selected from the group consisting of epoxy resin, acrylic resin, polyurethane, urethane resin, silastic resin, poly-p-xylene resin, bismaleimide resin, styrene-ethylene-butene-styrene block copolymer, polyimide resin and polyamide-imide; wherein a content of the bio-based resin in the bio-based insulating layer is more than 0 to 100 wt. % and a content of the petrochemical-based resin in the bio-based insulating layer is 0 to 80 wt. % based on the total weight of the bio-based insulating layer, a content of the bio-based resin in the bio-based adhesive layer is more than 0 to 100 wt. % and a content of the petrochemical-based resin in the bio-based adhesive layer is 0 to 80 wt. % based on the total weight of the bio-based adhesive layer, and a content of the bio-based resin in the bio-based electrically conductive adhesive layer is more than 0 to 95 wt. % and a content of the petrochemical-based resin in the bio-based electrically conductive adhesive layer is 0 to 70 wt. % based on the total weight of the bio-based electrically conductive adhesive layer.

5. The matte-type electromagnetic interference shielding film comprising bio-based component of claim 2, wherein at least one of the bio-based insulating layer and the bio-based adhesive layer further comprises at least one inorganic powder selected from the group consisting of calcium sulfate, carbon black, silica, titania, zinc sulfide, zirconia, calcium carbonate, silicon carbide, boron nitride, alumina, talc, aluminum nitride, glass powder, quartz powder and clay, and the inorganic powder has a particle size of 10 nm to 20 μm; wherein a content of the inorganic powder in the bio-based insulating layer is more than 0 to 50 wt. % based on the total weight of the bio-based insulating layer, and a content of the inorganic powder in the bio-based adhesive layer is more than 0 to 50 wt. % based on the total weight of the bio-based adhesive layer.

6. The matte-type electromagnetic interference shielding film comprising bio-based component of claim 2, wherein at least one of the bio-based insulating layer and the bio-based adhesive layer further comprises at least one flame-retardant compound selected from the group consisting of halogen-containing compounds, phosphor-containing compounds, nitrogen-containing compounds and boron-containing compounds; wherein a content of the flame-retardant compound in the bio-based insulating layer is 1 to 40 wt. % based on the total weight of the bio-based insulating layer, and a content of the flame-retardant compound in the bio-based adhesive layer is 1 to 50 wt. % based on the total weight of the bio-based adhesive layer.

7. The matte-type electromagnetic interference shielding film comprising bio-based component of claim 2, wherein at least one of the bio-based insulating layer and the bio-based adhesive layer further comprises an inorganic pigment and/or an organic pigment, and the inorganic pigment is at least one selected from the group consisting of cadmium red, lemon cadmium yellow, orange cadmium yellow, titania, carbon black, black iron oxide and black complexed inorganic pigment, and the organic pigment is at least one selected from the group consisting of aniline black, paliogen black, anthraquinone black, benzidine-based yellow pigment, phthalocyanine blue and phthalocyanine green; wherein a content of the inorganic and/or the organic pigment in the bio-based insulating layer is more than 0 to 50 wt. % based on the total weight of the bio-based insulating layer, and a content of the inorganic and/or the organic pigment in the bio-based adhesive layer is more than 0 to 50 wt. % based on the total weight of the bio-based adhesive layer.

8. The matte-type electromagnetic interference shielding film comprising bio-based component of claim 2, wherein at least one of the bio-based insulating layer, the bio-based adhesive layer and the bio-based electrically conductive adhesive layer further comprises an additive which is at least one selected from a curing agent, a catalyst and a surfactant; wherein a content of the additive in the bio-based insulating layer is more than 0 to 20 wt. % based on the total weight of the bio-based insulating layer, a content of the additive in the bio-based adhesive layer is more than 0 to 20 wt. % based on the total weight of the bio-based adhesive layer, and a content of the additive in the bio-based electrically conductive adhesive layer is more than 0 to 10 wt. % based on the total weight of the bio-based electrically conductive adhesive layer.

9. The matte-type electromagnetic interference shielding film comprising bio-based component of claim 1, wherein the plated metal layer is a copper foil layer, a silver foil layer, an aluminum foil layer or a nickel foil layer with a thickness of 0.1 to 5 μm.

10. The matte-type electromagnetic interference shielding film comprising bio-based component of claim 1, wherein the bio-based electrically conductive adhesive layer is a single-layer electrically conductive adhesive layer having a plurality of electrically conductive particles, and the material forming the plurality of electrically conductive particles is at least one selected from the group consisting of copper, silver, nickel, tin, gold, palladium, aluminum, chromium, titanium, zinc, carbon, nickel-gold alloy, gold-silver alloy, copper-nickel alloy, copper-silver alloy, nickel-silver alloy and copper-nickel-gold alloy; wherein a content of the plurality of electrically conductive particles is 5 to 85 wt. % based on the total weight of the bio-based electrically conductive adhesive layer.

11. The matte-type electromagnetic interference shielding film comprising bio-based component of claim 1, wherein the bio-based electrically conductive adhesive layer has a double-layer structure and is formed by laminating an adhesive layer without electrically conductive particles and an electrically conductive adhesive layer having a plurality of electrically conductive particles; wherein the adhesive layer without electrically conductive particle is adherent between the metal layer and the electrically conductive adhesive layer having the plurality of electrically conductive particles; wherein a content of the plurality of electrically conductive particles in the electrically conductive adhesive layer is 5 to 85 wt. % based on the total weight of the electrically conductive adhesive layer.

12. The matte-type electromagnetic interference shielding film comprise bio-based component of claim 1, wherein the bio-based insulating layer has a hardness of 2H to 6H.

13. A preparation method for a matte-type electromagnetic interference shielding film of claim 1 comprising bio-based component, comprising:

after forming a bio-based insulating layer on a support layer, curing the bio-based insulating layer under a condition of 50° C. to 180° C.;

forming a plated metal layer on the bio-based insulating layer by using one of selected from vacuum sputtering, evaporation deposition, chemical plating and electroplating;

forming a bio-based electrically conductive adhesive layer on the plated metal layer, allowing the plated metal layer to be located between the bio-based insulating layer and the bio-based electrically conductive adhesive layer; and laminating a release layer on the bio-based electrically conductive adhesive layer.

14. The preparation method of a matte-type electromagnetic interference shielding film comprising bio-based component of claim 13, further comprising, prior to forming the plated metal layer, forming another bio-based insulating layer on the bio-based insulating layer and curing said another bio-based insulating layer under a condition of 50° C. to 180° C., then forming the plated metal layer, allowing the plated metal layer to be located between said another bio-based insulating layer and the bio-based electrically conductive adhesive layer.

15. The preparation method of a matte-type electromagnetic interference shielding film comprising bio-based component of claim 13, further comprising, prior to forming the plated metal layer, forming a bio-based adhesive layer on the bio-based insulating layer by using a coating method or a transfer method, then forming the plated metal layer, allowing the plated metal layer to be located between the bio-based adhesive layer and the bio-based electrically conductive adhesive layer.

16. The preparation method of a matte-type electromagnetic interference shielding film comprising bio-based component of claim 14, further comprising, prior to forming the plated metal layer, forming a bio-based adhesive layer on said another bio-based insulating layer by using a coating method or a transfer method, then forming the plated metal layer, allowing the plated metal layer to be located between the bio-based adhesive layer and the bio-based electrically conductive adhesive layer.

* * * * *